(12) United States Patent
Teysseyre et al.

(10) Patent No.: US 11,610,832 B2
(45) Date of Patent: Mar. 21, 2023

(54) HEAT TRANSFER FOR POWER MODULES

(71) Applicant: SEMICONDUCTOR COMPONENTS INDUSTRIES, LLC, Phoenix, AZ (US)

(72) Inventors: Jerome Teysseyre, Scottsdale, AZ (US); Roveendra Paul, Fremont, CA (US); Dukyong Lee, Bucheon (KR)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/929,662

(22) Filed: May 14, 2020

(65) Prior Publication Data

US 2020/0335414 A1    Oct. 22, 2020

Related U.S. Application Data

(63) Continuation of application No. 15/968,353, filed on May 1, 2018, now Pat. No. 10,665,525.

(51) Int. Cl.
*H01L 23/367* (2006.01)
*H01L 23/373* (2006.01)
*H01L 23/40* (2006.01)

(52) U.S. Cl.
CPC ...... *H01L 23/3675* (2013.01); *H01L 23/3735* (2013.01); *H01L 23/4006* (2013.01); *H01L 2023/405* (2013.01); *H01L 2023/4031* (2013.01); *H01L 2023/4056* (2013.01); *H01L 2023/4087* (2013.01)

(58) Field of Classification Search
CPC ............. H01L 23/3675; H01L 23/3735; H01L 23/4006; H01L 2023/4087; H01L 2023/405; H01L 2023/4056; H01L 2023/4031; H01L 23/473; H01L 23/367; H01L 23/467; H01L 21/50
See application file for complete search history.

(56) References Cited

U.S. PATENT DOCUMENTS

| | | | | |
|---|---|---|---|---|
| 4,879,629 A | * | 11/1989 | Tustaniwskyj | ...... H01L 23/4332 257/E23.091 |
| 4,884,630 A | * | 12/1989 | Nelson | .................. H01L 23/473 257/E23.098 |
| 5,323,292 A | * | 6/1994 | Brzezinski | .......... H01L 23/3675 165/104.33 |
| 6,639,354 B1 | * | 10/2003 | Kojima | ................... H01L 33/20 313/506 |

(Continued)

OTHER PUBLICATIONS

U.S. Appl. No. 15/968,353, filed May 1, 2018, Allowed.

(Continued)

*Primary Examiner* — Ahmed N Sefer
(74) *Attorney, Agent, or Firm* — Brake Hughes Bellermann LLP

(57) ABSTRACT

In one general aspect, an apparatus can include a module including a semiconductor die. The apparatus can include a heatsink coupled to the module and including a substrate, and a plurality of protrusions. The apparatus includes a cover defining a channel where the channel is outside of the module and the plurality of protrusions of the heatsink are disposed within the channel, and a sealing mechanism is disposed between the cover and the module is in contact with the module.

23 Claims, 21 Drawing Sheets

(56) References Cited

U.S. PATENT DOCUMENTS

| | | | |
|---|---|---|---|
| 6,972,957 B2 | 12/2005 | Beihoff et al. | |
| 9,638,477 B1 | 5/2017 | Choi et al. | |
| 2004/0179339 A1* | 9/2004 | Mayer | H01L 23/367 361/704 |
| 2006/0002090 A1* | 1/2006 | Liao | H01L 23/427 361/710 |
| 2006/0096299 A1 | 5/2006 | Mamitsu et al. | |
| 2008/0023807 A1 | 1/2008 | Noquil et al. | |
| 2009/0116197 A1 | 5/2009 | Funakoshi et al. | |
| 2009/0283902 A1* | 11/2009 | Bezama | H01L 23/3675 257/713 |
| 2009/0294195 A1 | 12/2009 | Otsuka et al. | |
| 2009/0321924 A1 | 12/2009 | Funakoshi et al. | |
| 2010/0097105 A1* | 4/2010 | Morita | H01L 27/0605 327/425 |
| 2010/0142150 A1* | 6/2010 | Campbell | H01L 23/473 165/104.19 |
| 2010/0175857 A1 | 7/2010 | Gerstler et al. | |
| 2010/0328893 A1 | 12/2010 | Higashidani et al. | |
| 2011/0260314 A1 | 10/2011 | Minotti | |
| 2013/0050944 A1* | 2/2013 | Shepard | H01L 23/473 361/703 |
| 2013/0099364 A1 | 4/2013 | Liu et al. | |
| 2014/0159216 A1* | 6/2014 | Ishino | H01L 23/3114 257/675 |
| 2014/0327127 A1* | 11/2014 | Hable | H01L 23/34 257/712 |
| 2014/0327128 A1* | 11/2014 | Yoo | H01L 21/4803 257/713 |
| 2015/0008574 A1 | 1/2015 | Gohara et al. | |
| 2016/0136851 A1 | 5/2016 | Campbell et al. | |
| 2016/0197028 A1 | 7/2016 | Yamada et al. | |
| 2016/0343640 A1 | 11/2016 | Gohara et al. | |
| 2016/0351468 A1 | 12/2016 | Liang | |
| 2017/0231113 A1* | 8/2017 | Anderl | H01L 23/4006 |
| 2017/0330815 A1* | 11/2017 | Mische | H01L 23/4006 |
| 2018/0082925 A1* | 3/2018 | Grassmann | H01L 23/473 |
| 2018/0109250 A1* | 4/2018 | Shah | H01L 29/7787 |
| 2018/0277730 A1* | 9/2018 | Nagase | C22C 5/02 |
| 2019/0096785 A1* | 3/2019 | Walczyk | F28D 15/0241 |
| 2019/0221499 A1* | 7/2019 | Chang | G06F 1/203 |

OTHER PUBLICATIONS

Danfoss Silicon Power GmbH, "Shower Power cooling concept", DKSPPM301A302, Application Note, Apr. 2016.

S. Narumanchi et al., "Advanced Power Electronics and Electric Motors Annual Report—2013", National Renewable Energy Laboratory, Technical Report, NREL/TP-5400-60621, Jan. 2015.

* cited by examiner

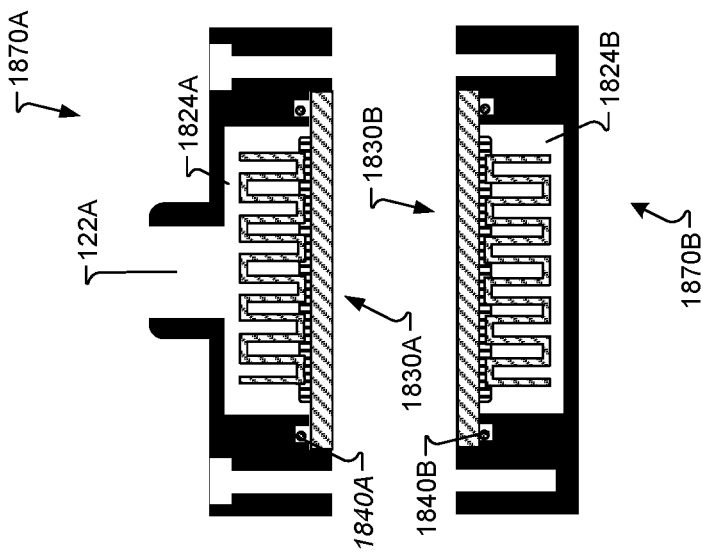
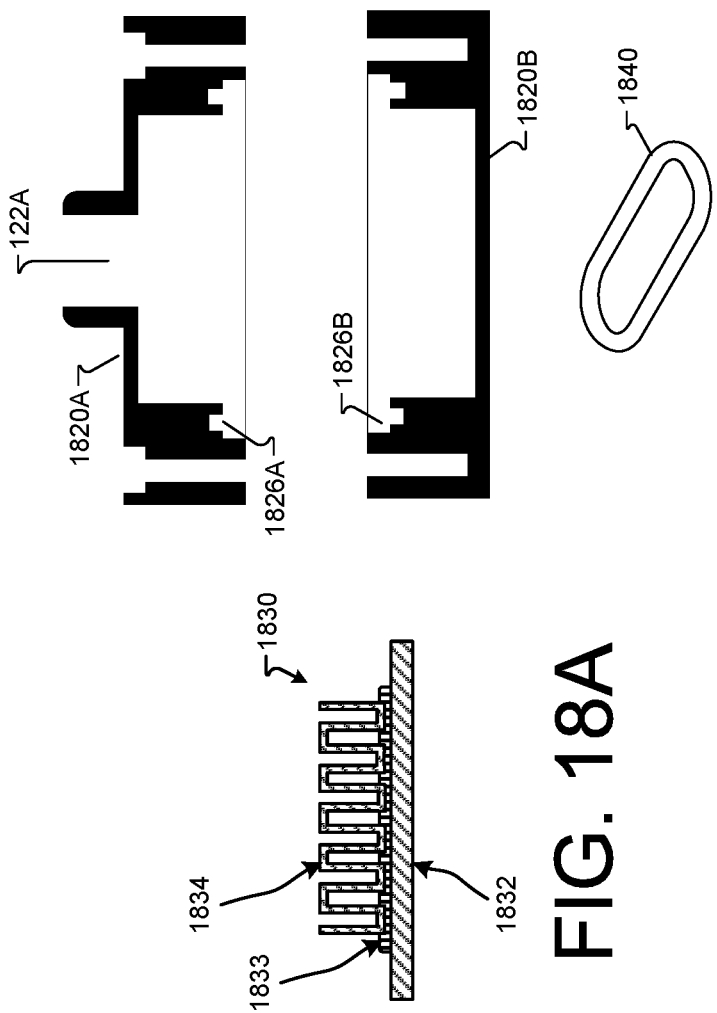
FIG. 18A
FIG. 18B
FIG. 18C

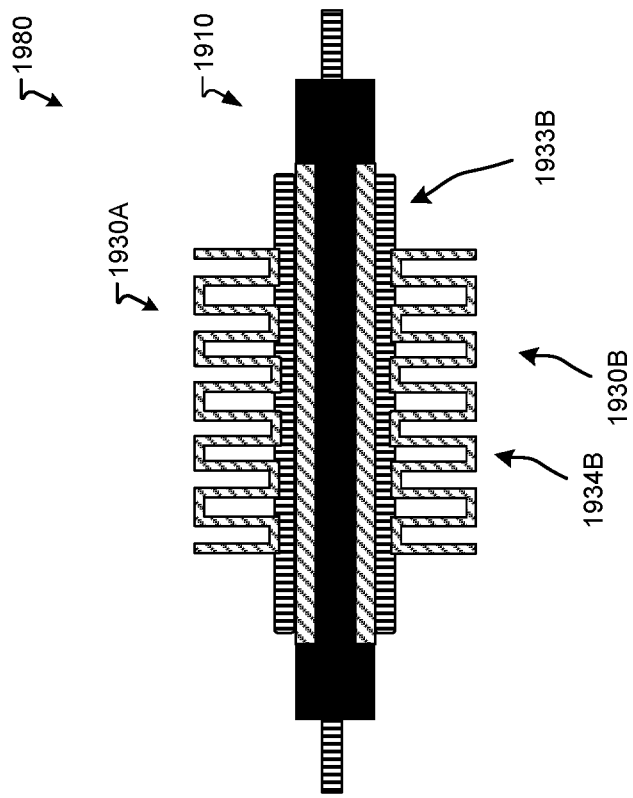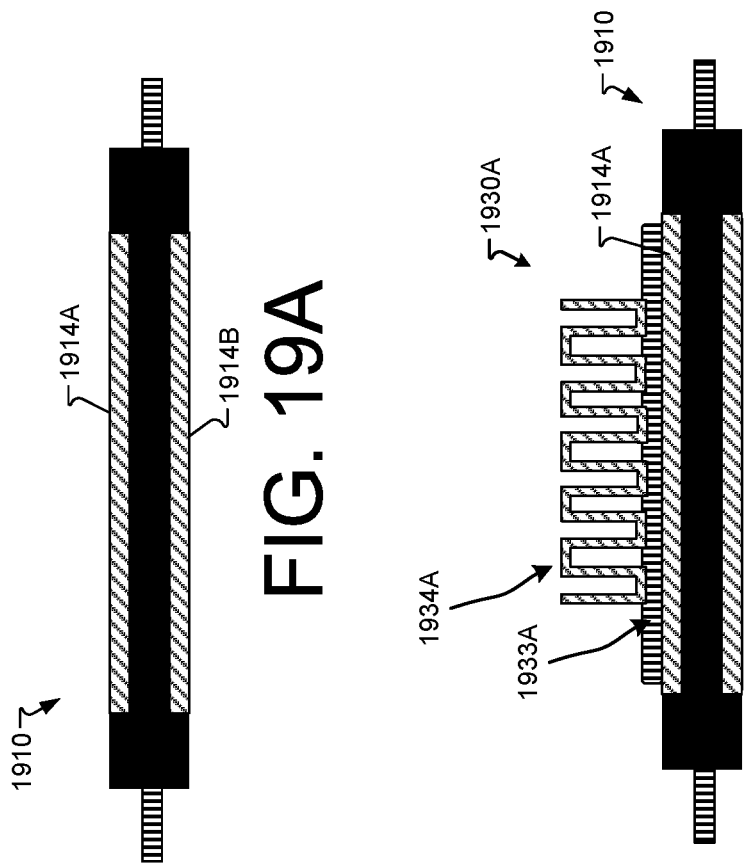
FIG. 19A
FIG. 19B
FIG. 19C

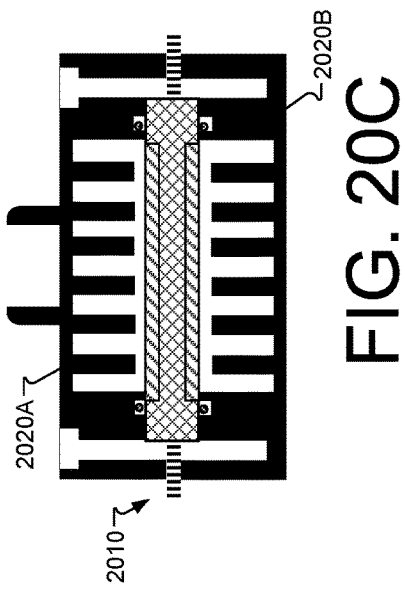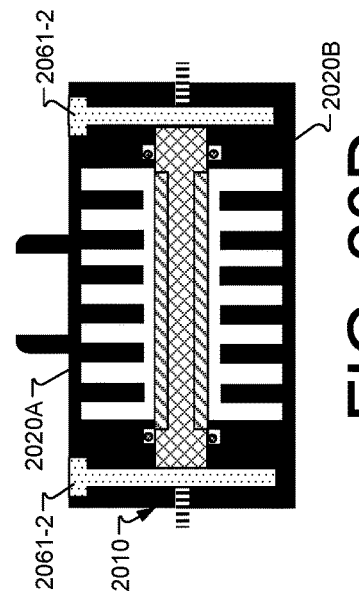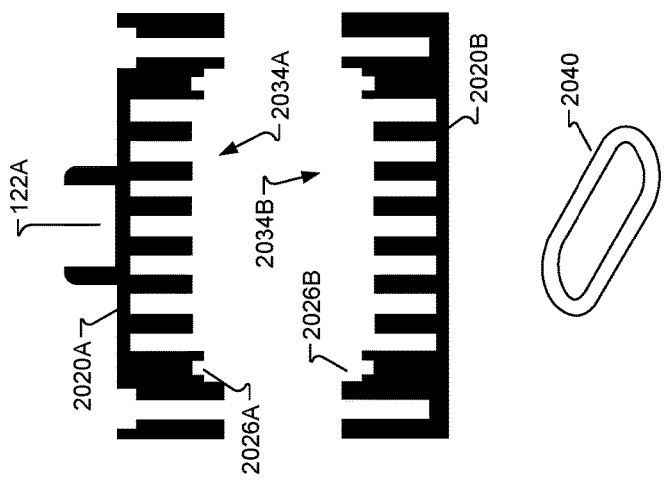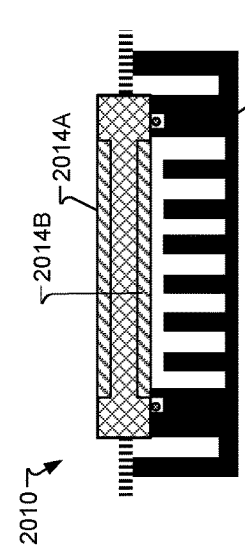

```
Forming a module including a semiconductor
die and a direct bonded metal substrate
                                      2200
```

↓

```
Coupling a cover around at least a portion of
the module such that a heat-transfer
mechanism is disposed within a channel of
the cover between a wall of the cover and the
module                                 2210
```

HEAT TRANSFER FOR POWER MODULES

RELATED APPLICATION

This application is a continuation of U.S. Non-provisional application Ser. No. 15/968,353, filed on May 1, 2018, which is incorporated by reference herein in its entirety.

TECHNICAL FIELD

This description generally relates to heat transfer technologies related to modules.

BACKGROUND

In general, a heatsink can transfer heat generated by electronic components included in a power supply to, for example, an air coolant. By transferring or directing heat away from the electronic components, the temperature of the electronic components can be regulated to desirable levels. Regulating the temperature of the electronic components to avoid overheating can also prevent damage to the electronic components. Any overheating of or damage to the electronic components in the power supply can negatively impact the performance of the power supply and, in some cases, can result in the complete failure of the power supply. The heatsinks used in some technologies may not be desirable for certain applications.

SUMMARY

In one general aspect, an apparatus can include a module including a semiconductor die. The apparatus can include a heatsink coupled to the module and including a substrate, and a plurality of protrusions. The apparatus includes a cover defining a channel where the channel is outside of the module and the plurality of protrusions of the heatsink are disposed within the channel, and a sealing mechanism is disposed between the cover and the module is in contact with the module.

The details of one or more implementations are set forth in the accompanying drawings and the description below. Other features will be apparent from the description and drawings, and from the claims.

BRIEF DESCRIPTION OF THE DRAWINGS

FIGS. 18A through 18H illustrate a method of manufacturing at least some of the heatsink-based module assemblies described herein.

FIGS. 19A through 19F illustrate another method of manufacturing at least some of heatsink-based module assemblies described herein.

FIGS. 20A through 20D illustrate a method of manufacturing at least some of cover-protrusion module assemblies described herein.

DETAILED DESCRIPTION

Figure 1A:
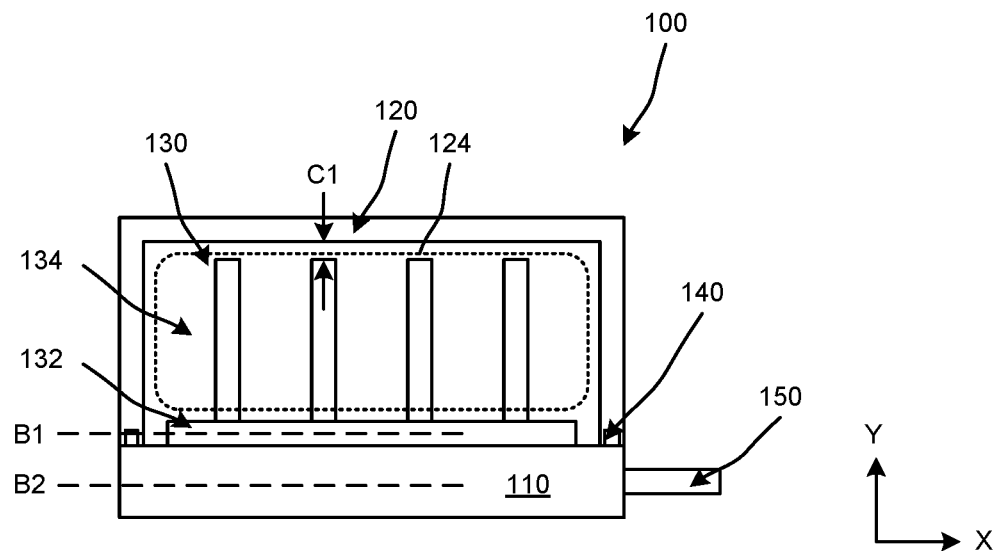
FIGS. 1A through 1E are diagrams that illustrate various views of a module assembly.

A module assembly as described herein includes a module that can include a semiconductor die encapsulated in a molding material, and a direct bonded metal (DBM) substrate electrically coupled to the semiconductor die. The module assembly can include a cover around at least a portion of the module such that a heat-transfer mechanism is disposed within a channel of the cover. The heat-transfer mechanism can be, or can include, a heatsink, protrusions extending from the cover, and/or so forth. The module assemblies described herein can be configured as dual-cool module assemblies, and the modules can have more than one DBM substrate.

The module assemblies described herein can be configured to provide adequate cooling for modules while meeting size and cost objectives for the module assemblies. In some implementations, heat-transfer mechanisms (e.g., heatsinks) included in the module assemblies can be fabricated using a metallic material. In order to reduce overall module assembly costs, however, heat-transfer mechanisms can be fabricated as composite metal and plastic structures or, in some cases, as just plastic structures.

In some implementations, the heat-transfer mechanisms can provide non-direct cooling to the components included in the module assemblies. In some implementations, the heat-transfer mechanisms for a module assembly can provide direct cooling to the components included in the module assemblies using a dual-sided cooling module. In some implementations, heat-transfer mechanisms in the module assemblies can provide a combination of non-direct and direct cooling to the components included in the module assemblies. Such heat-transfer mechanisms can be referred to as a hybrid heat-transfer mechanism or a hybrid heat-transfer structure.

A hybrid heat-transfer mechanism can provide high performance cooling at a low cost because the hybrid heat-transfer mechanism can be designed and assembled to provide direct cooling, can include protrusions (e.g., fin) attached to a direct bonded metal (DBM) substrate (e.g., directed bonded copper (DBC) substrate, a substrate with a dielectric layer disposed between two metal layers (e.g., one or more metal layers with electrical traces)), and can include a tubular heat-transfer design for use by dual cooling modules. In some implementations, the hybrid heat-transfer mechanism can eliminate the use of a thermal interface material (TIM) between the DBC substrate and a copper base plate.

The module assemblies described herein can include the use of the hybrid heat-transfer mechanisms including leakage prevention of the liquid coolant along with package alignment in a molded fully plastic structure. The molded fully plastic structure for the hybrid heat-transfer mechanisms can provide improved creepage distances between components as compared to conventional structures. The molded fully plastic structure can provide scalability for one to three or more modules, allowing horizontal and/or vertical stack-up of the modules. The hybrid heat-transfer mechanisms described herein can provide improved thermal performance reducing a die size for the overall module assembly while providing an improvement to a maximum current capability for the module assembly.

For example, heat-transfer mechanisms described herein and, in particular, a hybrid heat-transfer mechanism can be included in a variety of module assemblies for applications including high-power device applications. For example, the high-power device applications can include high power applications greater than, for example, 600 V (e.g., especially when using silicon carbide (SiC) die) and high power applications greater than, for example, 400 V (e.g., when using silicon die). In some implementations, the module assemblies can be included in a variety of applications including, but not limited to, automotive applications (e.g., automotive high power modules (AHPM), electrical vehicles, hybrid electrical vehicles), computer applications, industrial equipment, on-board charging applications, inverter applications, and/or so forth.

Figure 1B:
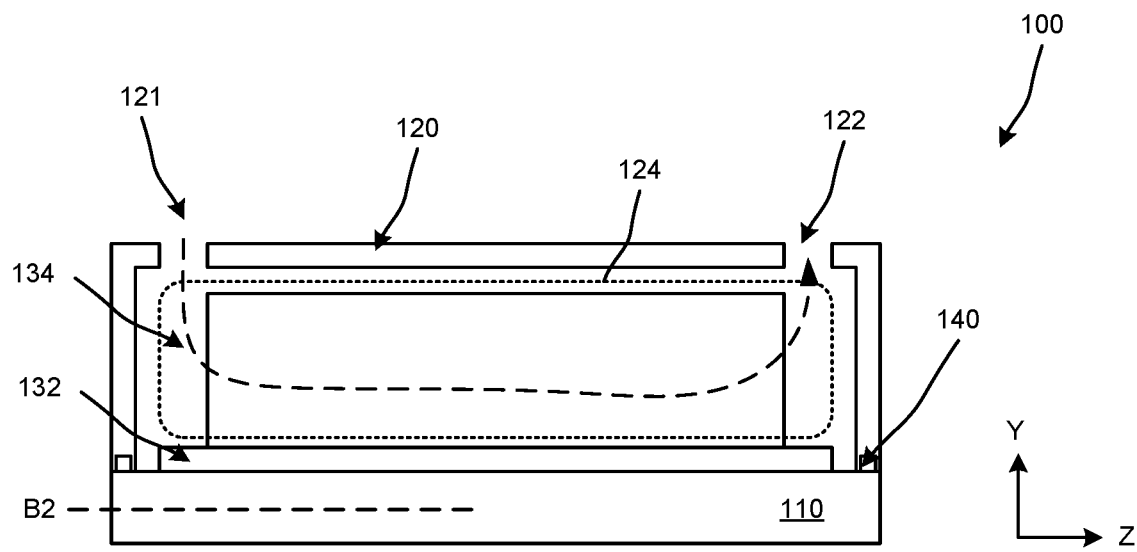
Figure 1C:
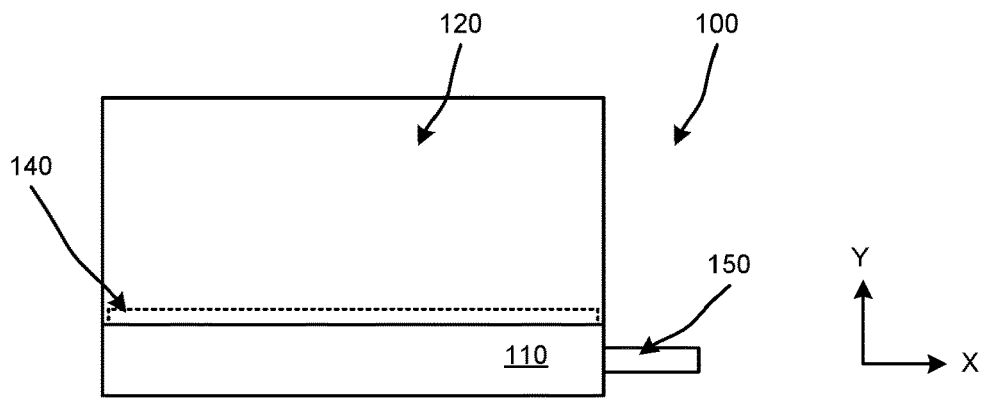
Figure 1D:
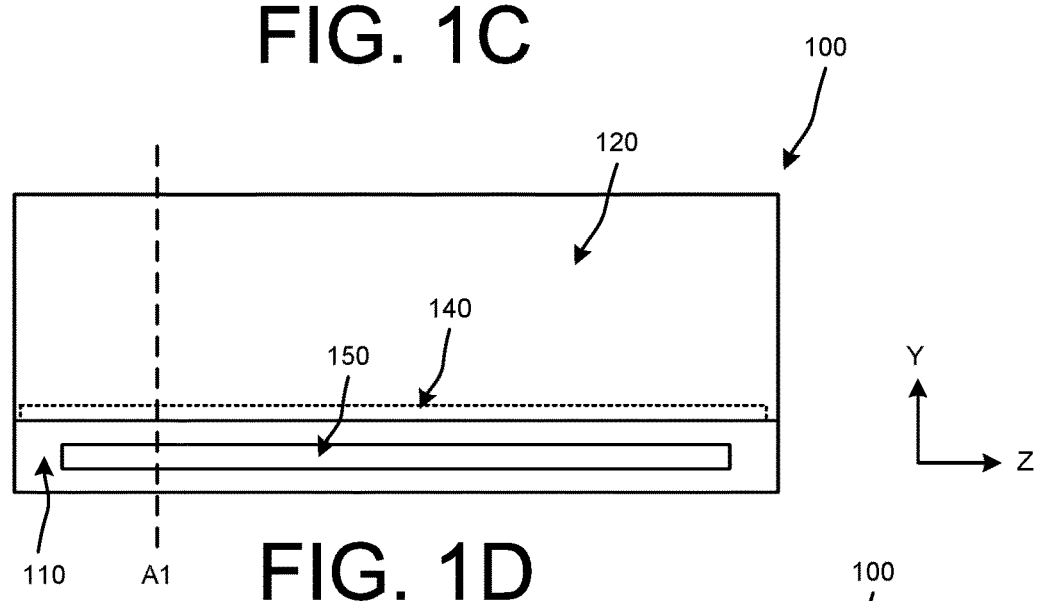
Figure 1E:
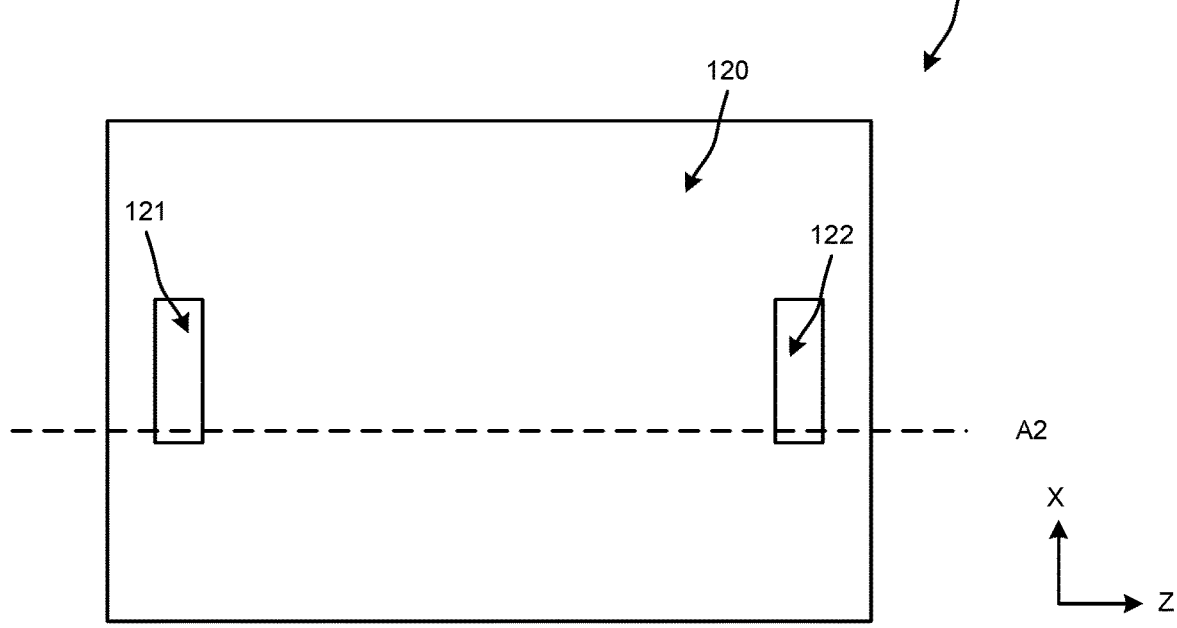

FIGS. 1A through 1E are diagrams that illustrate various views of a module assembly 100 according to some implementations. FIGS. 1A and 1B are diagrams that illustrate cross-sectional views of the module assembly 100. FIGS. 1C through 1E are diagrams that illustrate front, side, and top views, respectively, of the module assembly 100. FIG. 1A is a cross-sectional view cut along line A1 of FIG. 1D, and FIG. 1B is a cross-sectional view cut along line A2 of FIG. 1E.

As shown in FIG. 1A, the module assembly 100 includes a module 110 coupled to a heatsink 130. The heatsink 130 is disposed within a channel 124 of a cover 120 (also can be referred to as a module cover). The heatsink 130 can be referred to as a heat-transfer mechanism (e.g., a heat-transfer element) or can be a type of heat-transfer mechanism. The cover 120 is disposed around at least a portion of the module 110.

Although the orientation of the devices can be flipped or reversed, to simplify the description of some of the elements herein, the top direction will be referenced with respect to top of the page and the bottom direction will be referenced with respect to the bottom of the page. A direction extending between the top and bottom can be referred to as a vertical direction (Y direction), and a direction (X or Z direction depending on orientation of the figure) orthogonal to the vertical direction can be referred to as a horizontal direction (or lateral direction).

As shown in FIG. 1B, the cover 120 includes an inlet opening 121 and an outlet opening 122 such that a fluid (e.g., a gas (e.g., air), water, a coolant) may flow within the channel 124 and around the heatsink 130. Accordingly, the inlet opening 121 can be in fluid communication with the outlet opening 122 via the channel 124. The openings 121, 122 can be bi-directional openings so that fluid may flow in the opposite direction through the channel 124. The openings 121, 122 are openings through at least a portion (e.g., a wall) of the cover 120.

An example fluid flow direction is illustrated by the dashed line shown in FIG. 1B. In this implementation, heat may be transferred (e.g., efficiently transferred) away from the module 110 via the heatsink 130 and the fluid flowing within the channel 124. The module 110 is aligned along plane B2 such that the module 110 is aligned along the direction of fluid flow between the inlet opening 121 and the outlet opening 122.

As shown in FIG. 1A, the heatsink includes protrusions 134 (e.g., a plurality of protrusions) and a substrate 132 (also can be referred to as a base plate). Although not shown in FIG. 1A, in some implementations, a thermal interface material (TIM) can be disposed between the heatsink 130 and the module 110 to facilitate heat transfer between the module 110 and the heatsink 130.

As shown in FIG. 1A, the heatsink 130 is disposed between a wall (e.g., a top wall) of the cover 120 and the module 110. The heatsink 130 is also disposed between sidewalls of the cover 120.

The protrusions 134 shown in FIG. 1A extend from the substrate 132 toward an inner surface of the cover 120 (along a direction non-parallel to (e.g., orthogonal to) the substrate 132). Because the protrusions 134 are included in a heatsink 130, the protrusions 134 can be referred to as heatsink protrusions.

As shown in FIGS. 1A and 1B, the protrusions 134 can be fins included within, or as part of, the heatsink 130. One or more of the protrusions 134 can be aligned longitudinally along the direction of the fluid flow. Accordingly, one or more of the protrusions 134 can be aligned longitudinally between the inlet opening 121 and the outlet opening 122. In some implementations, the heatsink 130 can include more protrusions 134 than shown in FIGS. 1A and 1B.

The protrusions 134 as shown in FIG. 1A have a narrow lateral width (along the X direction) relative to a vertical height (along the Y direction). The protrusions 134 as shown in FIG. 1B have a relatively long longitudinal length (along the Z direction) relative to the width or height. In some implementations, the protrusions 134 can have a different shape than shown in FIGS. 1A and 1B. Different protrusion shapes are shown and described in more detail below.

In some implementations, the substrate 132 and one or more of the protrusions 134 can be monolithically formed. In some implementations, one or more of the protrusions 134 can be coupled (e.g., welded, soldered, glued) to the substrate 132. In the implementations described herein, when a element is coupled to or in contact with another element, the elements can be thermally coupled or thermally contacted via, for example, a thermal interface material, a solder, a conductive glue and/or so forth.

The heatsink 130 (and portions thereof) can be made of a variety of materials including metallic materials, and/or alloys thereof, (e.g., copper, aluminum, nickel, nickel-plated metals, etc.). In some implementations, one or more portions of the heatsink 130 can be made of a plastic material. In some implementations, the substrate 132 and one or more of the protrusions 134 can be made of a different material.

Although not shown in FIG. 1A, the module 110 can include one or more semiconductor die (e.g., silicon semiconductor die, silicon carbide (SiC) semiconductor die). The semiconductor die can be encapsulated within a molding (e.g., a molding material (e.g., an epoxy)) included in module 110. The semiconductor die can include a power semiconductor die. In some implementations, the semiconductor die can include a vertical metal oxide semiconductor field effect transistor (MOSFET) device, a bipolar junction transistor (BJT) device, a diode device, an application-specific integrated circuit (ASIC), passive components (e.g., resistors, capacitors, inductors), and/or so forth.

Although not shown, in some implementations, the module 110 can include one or more direct bonded metal (DBM)

(e.g., directed bonded copper (DBC)) substrates. For example, a first DBM substrate can be disposed on first side of the module 110 and a second DBM substrate can be disposed on a second side of the module 110. Semiconductor die can be disposed within the module between the first and second DBM substrates. An outer surface of one or more of the DBM substrates can be exposed and can define at least a portion of a surface of the module 100. In some implementations, one or more semiconductor die can be coupled to an inner surface of one or more of the DBM substrates.

In some implementations, the heatsink 130 can be coupled to one of the DBM substrates of the module 110. In some implementations, the module can be, for example, an automotive high power module (AHPM) package.

In this implementation, the substrate 132 is aligned along a plane B1 and the module 110 is aligned along a plane B2. Accordingly, the substrate 132 is aligned parallel to the module 110. In some implementations, the substrate 132 may not be aligned parallel to the module 110.

In this implementation, the protrusions 134 of the heatsink 130 are aligned orthogonal to the plane B1. In some implementations, one or more of the protrusions 134 may not be aligned orthogonal to the plane B1. In some implementations, a first protrusion from the protrusions 134 may be not be aligned parallel to a second protrusion from the protrusions 134.

As shown in FIG. 1A, a top end of each of the protrusions 134 can be spaced by a gap C1 from a top inner surface of the cover 120. The gap C1 can be relatively small (e.g., 3 times or smaller) compared with a height of the protrusions 134 (to facilitate heat transfer). The top inner surface of the cover can be on an opposite side of the module assembly 100 relative to the module 110. The protrusions 134 can be aligned with the side inner surfaces of the cover 120. The top inner surface in the side inner surfaces of the cover 120 can generally define the boundaries (e.g., top and sides) of the channel 124.

In some implementations, a lateral spacing between the protrusions 134 can be equal or unequal. For example, a space between a first pair of protrusions 134 can be the same or different as a space between a second pair of protrusions 134.

In some implementations, the heatsink 130, and/or a portion thereof (e.g., the substrate 132 and/or the protrusions 134), can be entirely disposed within the channel 124 of the cover 120. In some implementations, the heatsink 130, and/or a portion thereof, can be entirely disposed within a cavity defined by the module 110 and the cover 120.

As shown in FIGS. 1A through 1D, a sealing mechanism 140 is coupled between the cover 120 and the module 110. The sealing mechanism 140 can be configured to prevent a fluid within the channel 124 from leaking through an interface between the cover 120 and the module 110. In this implementation, the sealing mechanism 140 is aligned, or disposed within, a plane parallel to at least one of plane B1 or plane B2. In some implementations, the sealing mechanism can be around (e.g., substantially around) a perimeter (or within or along a perimeter) of the module 110. In some implementations, the sealing mechanism can be around (e.g., substantially around) a perimeter of the cover 120. In some implementations, the sealing mechanism 140 can be an adhesive and/or sealant. In some implementations, the sealing mechanism 140 can be an o-ring disposed within a groove (e.g., dual groove o-ring) of the cover 120. In some implementations, the sealing mechanism 140 may not be disposed within a groove or a portion of the cover 120. More details regarding sealing mechanisms 140 are described below.

The cover 120 can be made of, for example, a plastic material. In some implementations, the cover 120 can be fabricated by molding a composite material. In some implementations, the cover 120 can be made using an injection molding process. In some implementations, the cover 120 can be made of, or can include, a metal material (e.g., a metallic alloy, aluminum, copper, steel, and/or so forth). In some implementations, the heatsink 130 can be made of a different (e.g., plastic versus metal) or the same material than the cover 120.

As shown in FIG. 1A, a lead 150 (also can be referred to as a leadframe portion) can be coupled to or included as part of the module 110. A semiconductor die included within the module 110 can be electrically coupled to the lead 150. The lead 150 can function as an electrical connection (e.g., an input/output (I/O) pin, a power pin, a ground pin, etc.) to the semiconductor die. Although the figures illustrate a single lead 150, multiple leads can be coupled to the module 110.

The top view of the module assembly 100 shown in FIG. 1E illustrates the inlet opening 121 and the outlet opening 122. In some implementations, the inlet opening 121 and/or the outlet opening 122 can have a different shape than shown in FIG. 1E. In some implementations, a port can be coupled to one or more of the inlet opening 121 and/or the outlet opening 122.

Figure 2A:
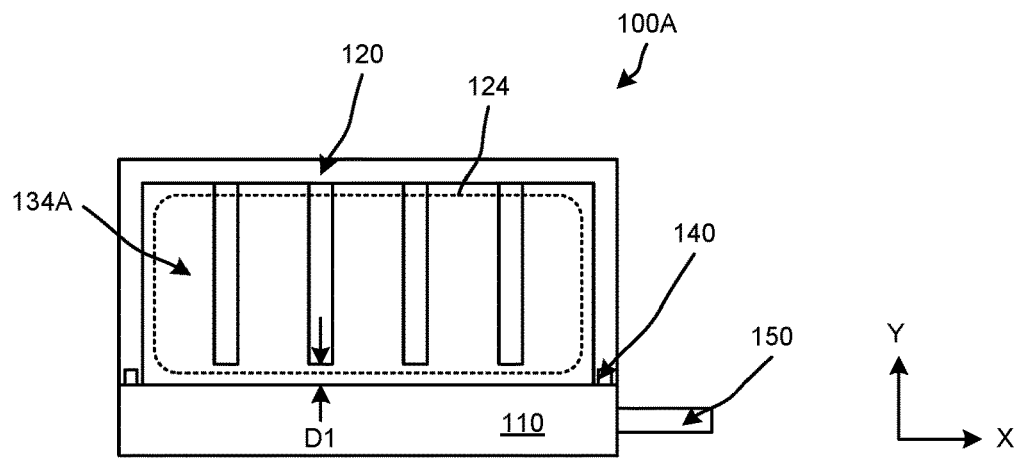
FIGS. 2A and 2B are diagrams that illustrate a variation of the module assembly shown in FIGS. 1A through 1E.
Figure 2B:
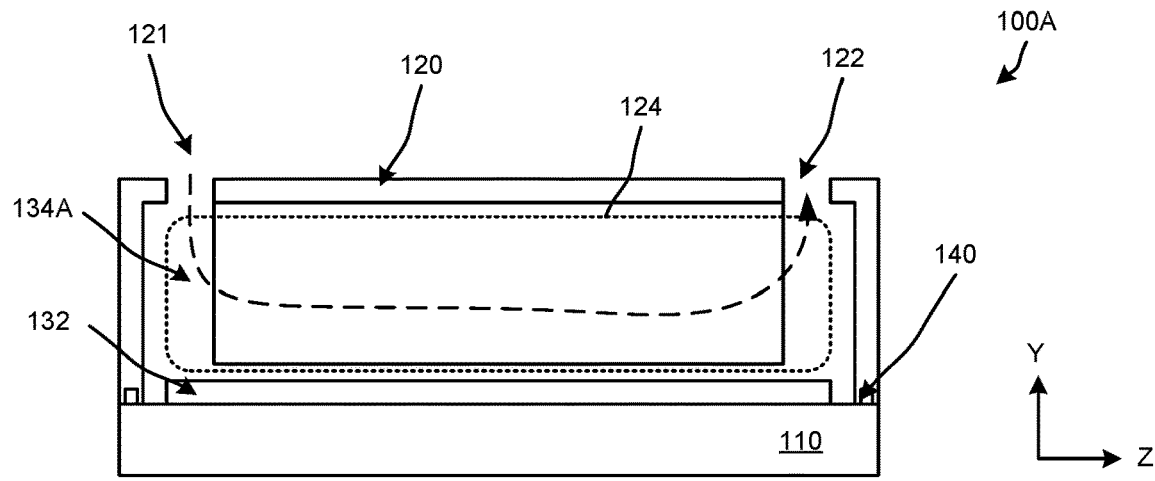

FIGS. 2A and 2B are diagrams that illustrate a variation of the module assembly 100 shown in FIGS. 1A through 1E. The module assembly 100 excludes a heatsink and instead includes protrusions 134A that extend from the cover 120. The protrusions 134A can be referred to as a heat-transfer mechanism or can be a type of heat-transfer mechanism. The outer views of the module assembly 100 shown in FIGS. 1C and 1E apply also to the module assembly 100 shown in FIGS. 2A and 2B. The features described above in connection with FIGS. 1A through 1E generally apply to the module assembly 100.

As shown in FIGS. 2A and 2B, the protrusions 134A extend from the cover 120 toward a top surface (e.g., exposed surface) of the module 110 (along a direction non-parallel to (e.g., orthogonal to) the module 110). Because the protrusions 134A extend from the cover 120, the protrusions 134A in this implementation can be referred to as cover protrusions. In some implementations, one or more of the protrusions 134A can be monolithically formed as part of the cover 120. In some implementations, the protrusions 134A can function as turbulizers. The cover protrusion implementations can be advantageous in that a thermal interface material may not be needed (compared with a thermal interface material between a heatsink and the module 110 in heatsink configurations).

As shown in FIG. 2A, the protrusions 134A are disposed between and extend from a wall (e.g., a top wall or portion) of the cover 120 and the module 110. The protrusions 134A are disposed between and are aligned along sidewalls (e.g., inner surfaces of the sidewalls) of the cover 120.

As shown in FIG. 2A, a bottom end of each of the protrusions 134A can be spaced by a gap D1 from a top surface of the module 110. The gap D1 can be relatively small (e.g., 3 times or smaller) compared with a height of the protrusions 134 (to facilitate heat transfer). The protrusions 134A can be aligned with the side inner surfaces of the cover 120. In some implementations, the protrusions 134A can be made of a different (e.g., plastic versus metal) or the same material as the cover 120.

Figure 3:
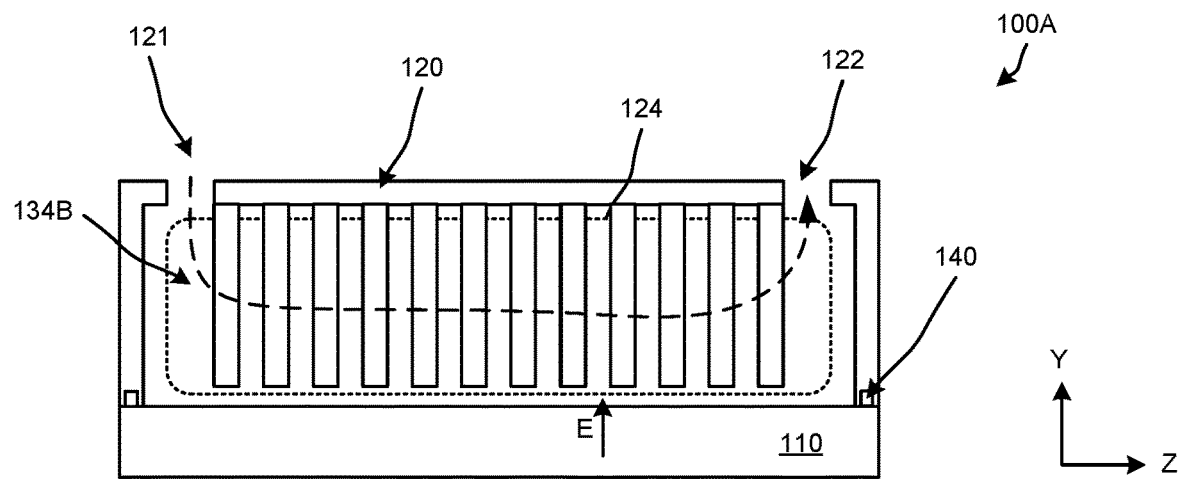
FIG. 3 is a diagram that illustrates a variation of the protrusions shown in FIG. 2B.

FIG. 3 is a diagram that illustrates a variation of the protrusions 134A shown in FIG. 2B. As shown in FIG. 3, the protrusions 134B have an elongate shape. In some implementations, the protrusions 134B can have a pillar shape, a cylindrical shape, a tapered shape, a spiral shape, and/or so forth. A cross-sectional profile of one or more of the protrusions 134B can have a square shape, a circular shape, an oval shape, rectangular shape, and/or so forth. The protrusions 134B as shown in FIG. 3 have a narrow lateral width (along the X direction) relative to a vertical height (along the Y direction). The protrusions 134B also have a relatively short length (along the Z direction) relative to the height. In some implementations, the width can be equal to or different than the length.

In some implementations, the protrusions 134B (when viewed along direction E shown in FIG. 3) can be arranged in a regular pattern, a random pattern, an irregular pattern, etc. The protrusions 134B can be arranged to mix a fluid flowing through the channel 124 between the inlet opening 121 and the outlet opening 122 to facilitate heat transfer.

FIGS. 4A through 4F are diagrams that illustrate variations of the module assemblies 100 shown in FIGS. 1A through 3.

Figure 4A:
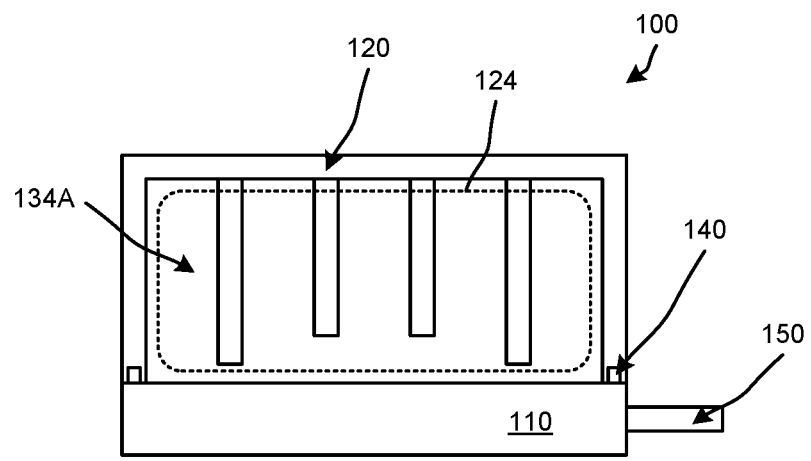
FIGS. 4A through 4F are diagrams that illustrate variations of the module assemblies shown in FIGS. 1A through 3.
Figure 4B:
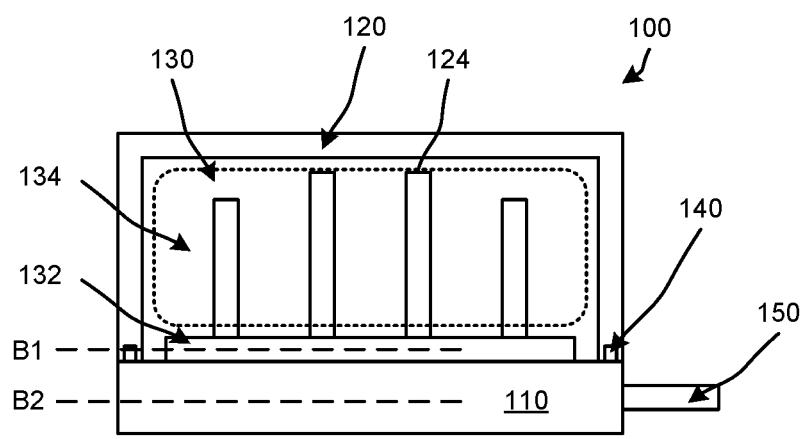

As shown in FIGS. 4A and 4B, a vertical height of at least some of the protrusions 134A and 134, respectively, is different (e.g., taller) than a vertical height of other of the protrusions (as opposed to an even height as in the other example implementations). In FIG. 4A, the protrusions 134A closest to the sidewalls of the cover 120 are taller than the protrusions 134A toward the middle portion of the cover 120. Although not shown in FIG. 4A, the protrusions 134A closest to the sidewalls of the cover 120 can be shorter than the protrusions 134A toward the middle portion of the cover 120.

In FIG. 4B, the protrusions 134 closest to the sidewalls of the cover 120 are shorter than the protrusions 134 toward the middle portion of the cover 120. Although not shown in FIG. 4B, the protrusions 134 closest to the sidewalls of the cover 120 can be taller than the protrusions 134 toward the middle portion of the cover 120.

Figure 4C:
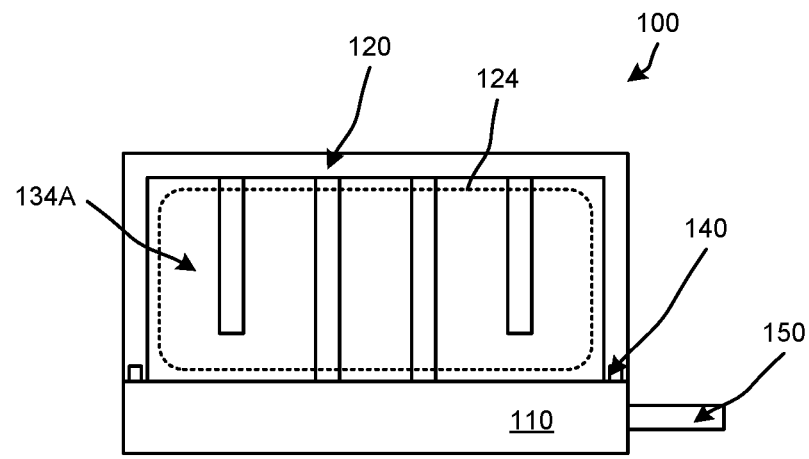

FIG. 4C illustrates protrusions 134A that extend from the cover 120 and are in contact with (e.g., in thermal contact with, coupled to) the top surface of the module 110. In this implementation, less than all of the protrusions 134A extend from the cover 120 to the top surface of the module 110. In some implementations, all of the protrusions 134A can extend from the cover 120 to the top surface of the module 110. A thermal interface material can be excluded from a top (upper) surface of the module 110.

Figure 4D:
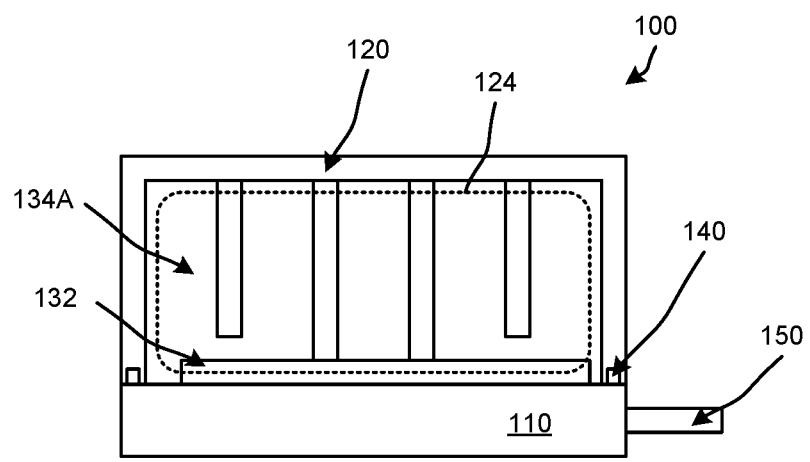

FIG. 4D illustrates protrusions 134A that extend from the cover 120 and are in contact with a substrate 132, which is disposed between the top surface of the module 110 and the protrusions 134A. In this implementation, less than all of the protrusions 134A extend from the cover 120 top surface of the module 110. In some implementations, all of the protrusions 134A can extend from the cover 120 to the top surface of the module 110. The protrusions 134A in contact with the substrate 132 can maintain the substrate 132 in a fixed position with respect to the module 110.

Figure 4E:
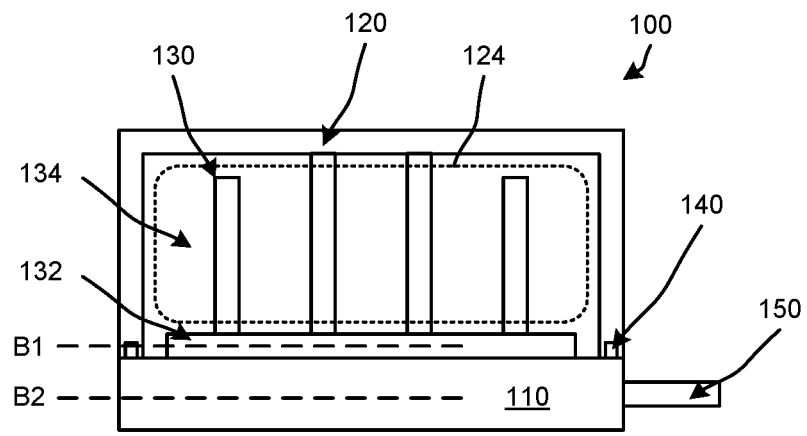

FIG. 4E illustrates protrusions 134 that extend from the heatsink 130 and are in contact with the top inner surface of the cover 120. In this implementation, less than all of the protrusions 134 extend from the heatsink 130 to the top inner surface of the cover 120. In some implementations, all of the protrusions 134 can extend from the heatsink 130 to the top inner surface of the cover 120. The protrusions 134 in contact with the cover 120 can maintain the heatsink 130 in a fixed position with respect to the module 110.

Figure 4F:
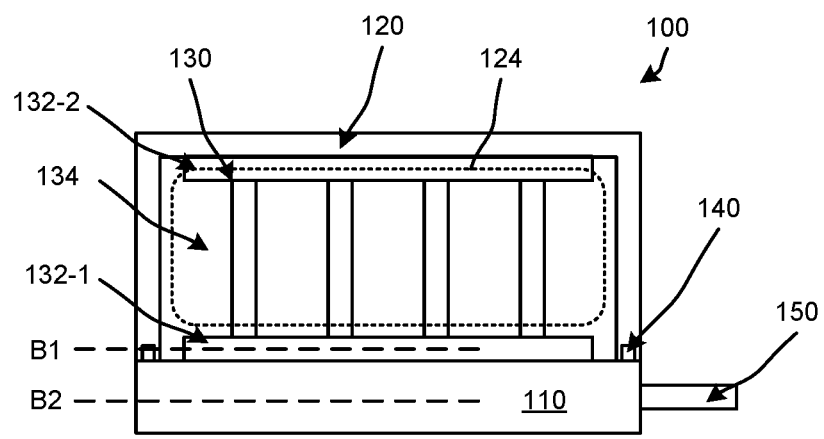

FIG. 4F illustrates protrusions 134 that extend between substrates 132-1 and 132-2. In this implementation, all of the protrusions 134A extend between the substrates 132-1 and 132-2. The contact of the heatsink 130 between (and with) the inner surface of the cover 120 and the module 110 can maintain the heatsink in a desirable fixed position and thermal contact with the module 110.

In some implementations, less than all of the protrusions 134A extend between the substrates 132-1 and 132-2. In some implementations, the substrate 132-2 may not be in contact with the cover 120. In other words, a top surface of the substrate 132-2 can be separated from the top inner surface of the cover 120.

Figure 5:
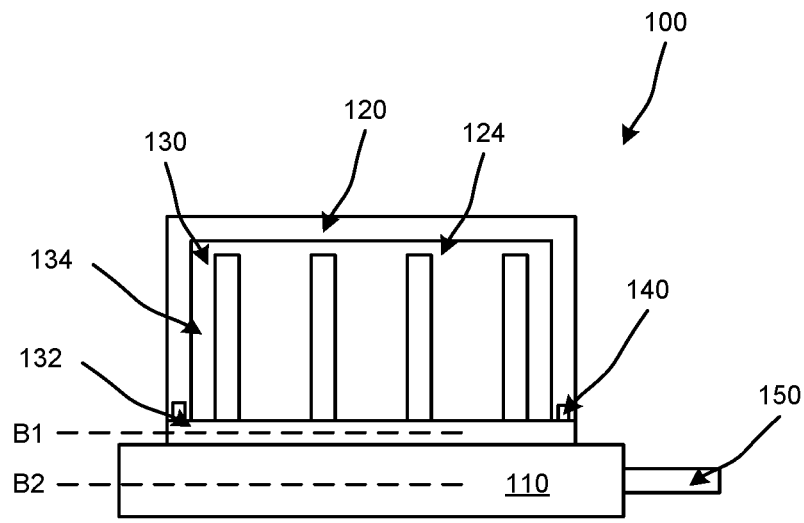
FIGS. 5 through 9B are diagrams that illustrate variations of module assemblies.

FIG. 5 is a diagram that illustrates a variation of the module assembly 100. In this implementation, the cover 120 terminates on top of the substrate 132 of the heatsink 130. Accordingly a width of the channel 124 is less than a width of the substrate 132. The sealing mechanism 140 is coupled between at least a portion of the cover 120 and the substrate 132. In this implementation, a portion of the substrate 132 is exposed outside of the cover 120 rather than being entirely enclosed within the cover 120. The substrate 132 is disposed between the cover and the module 110.

Figure 6:
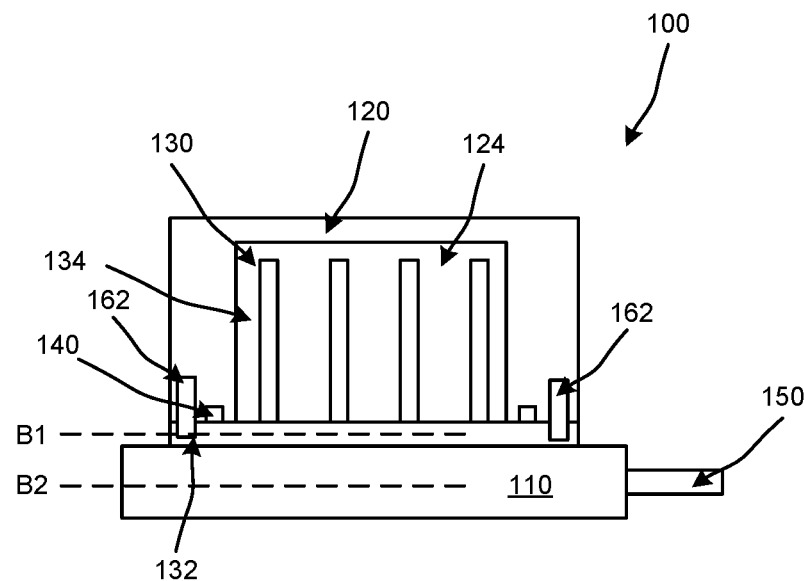

FIG. 6 is a diagram that illustrates another variation of the module assembly 100. In this implementation, the cover 120 terminates on top of the substrate 132 of the heatsink 130. In this implementation, coupling mechanisms 162 are configured to couple (e.g., fixedly couple) the cover 120 to the substrate 132. In this implementation, the substrate 132 can be fixedly coupled (e.g., welded, soldered, glued) to the module 110. Accordingly, the cover 120 is fixedly coupled within the module assembly 100 to the module 110 via the substrate 132. The substrate 132 is disposed between the cover and the module 110. As shown in FIG. 5, the sealing mechanism 140 is coupled between at least a portion of the cover 120 and the substrate 132. In this implementation, a portion of the substrate 132 is exposed outside of the cover 120 rather than being entirely enclosed within the cover 120.

In some implementations, less or more than two coupling mechanisms 162 can be used. In some implementations, one or more of coupling mechanism 162 can include a screw, a rivet, a clasp, a latch, an anchor, a spring, a glue, a press-fit component, and/or so forth. Although not shown in this implementation, in some implementations, one or more of the coupling mechanisms 162 can be disposed within an opening (e.g., an opening through, a hole, a recess) in the cover 120.

Figure 7:
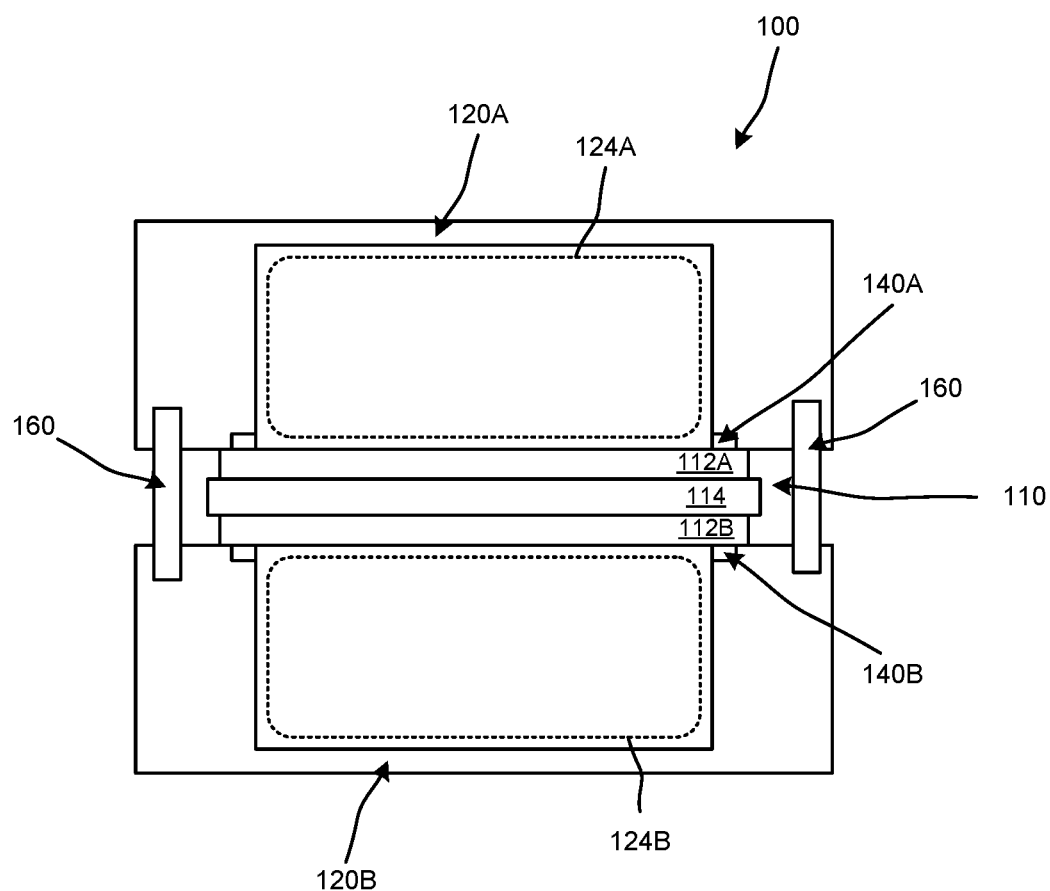

FIG. 7 is a diagram that illustrates the variation of the module assemblies 100 described herein. FIG. 7 illustrates a module assembly 100 that includes dual-sided cooling for the module 110. The features shown in FIG. 7 can be applied to any of the implementations described herein. For example, the implementations described in connection with FIGS. 1 through 6 can be applied in a dual-sided cooling configuration as shown in FIG. 7.

In the implementation shown in FIG. 7, the module assembly 100 includes a first cover 120A, a first channel 124A, and a first sealing mechanism 140A disposed on a first side (e.g., a top side) of the module 110 and a second cover 120B, a second channel 124B, and a second sealing mechanism 140B disposed on a second side (e.g., a bottom side) of the module 110. Although not shown, a heat-transfer mechanism such as a heatsink (e.g., heatsink 130), heatsink protrusions (e.g., protrusions 134), cover protrusions (e.g., protrusions 134A) and/or so forth can be disposed within the channel 124A and/or 124B.

In this implementation, a first DBM substrate 112A (e.g., DBC substrate) and a second DBM substrate 112B of the module 110 are shown. The portion 114 disposed between the DBM substrate 112A and the DBM substrate 112B can include a semiconductor die, molding material, one or more spacers, a leadframe, and/or so forth.

In this implementation, the first cover 120A (and elements included within the cover 120A) and the second cover 120B (and elements included within the cover 120A) are coupled about the module 110 via coupling mechanisms 160. In some implementations, the first cover 120A and the second cover 120B can be coupled in a fixed fashion about the module 110 via the coupling mechanisms 160 such that the module 110 is in a fixed position between the first cover 120A and the second cover 120B. In some implementations, the covers 120A, 120B are coupled via one or more of the coupling mechanisms 160 disposed lateral to the module 110.

In some implementations, less or more than two coupling mechanisms 160 can be used. In some implementations, one or more of the coupling mechanisms 160 can include, or can be, a screw (e.g., a spring-loaded screw), a rivet, a clasp, a latch, an anchor, a spring, a press-fit mechanism, a glue, and/or so forth. Although not shown in this implementation, in some implementations, one or more of the coupling mechanisms 160 can be disposed within an opening (e.g., an opening through, a hole, a recess) in the cover 120A and/or cover 120B. In some implementations, one or more coupling mechanisms 160 can be disposed within openings and/or recesses within one or more of the covers 120A, 120B.

Figure 8:
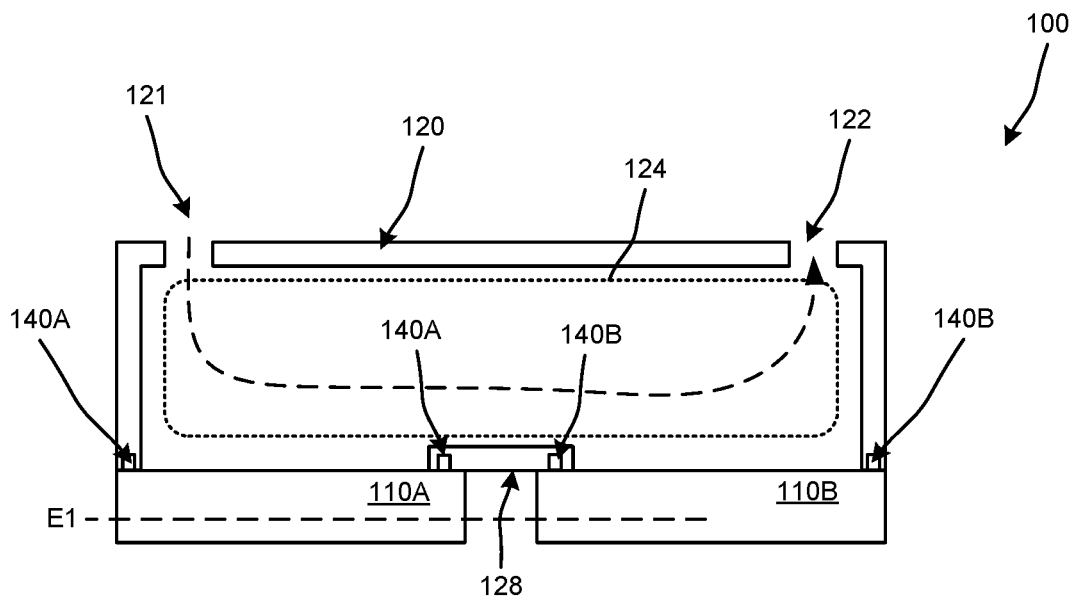

FIG. 8 is a diagram that illustrates another variation of the module assembly 100. In this implementation, the module assembly 100 includes two modules—module 110A and module 110B. The modules 110A, 110B in this implementation are aligned along the same plane E1. The modules 110A, 110B are also aligned along the direction of fluid flow between the inlet opening 121 and the outlet opening 122. Accordingly, the fluid flow within the channel 124 can be used to transfer heat away from both of the modules 110A, 110B.

Although not shown, a heatsink (e.g., heatsink 130), heatsink protrusions (e.g., protrusions 134), cover protrusions (e.g., protrusions 134A) and/or so forth can be disposed within the channel 124. Although not shown, a heat-transfer mechanism such as a heatsink (e.g., heatsink 130), heatsink protrusions (e.g., protrusions 134), cover protrusions (e.g., protrusions 134A) and/or so forth can be disposed within the channel 124. A separate heat-transfer mechanism can be associated with each of the modules 110A, 110B.

As shown in FIG. 8, a different sealing mechanism is associated with each of the modules 110A, 110B. Specifically, sealing mechanism 140A is associated with module 110A and sealing mechanism 140B is associated with module 110B. Accordingly, each of the modules 110A, 110B can be separately sealed with respect to the channel 124 and fluid flowing therethrough. The cover 120 includes a support portion 128 of the cover 120 disposed between the modules 110A, 110B.

The module assembly shown in FIG. 8 can also be configured in a dual-sided cooling configuration. Such dual-sided configurations are shown in FIGS. 9A and 9B.

Figure 9A:
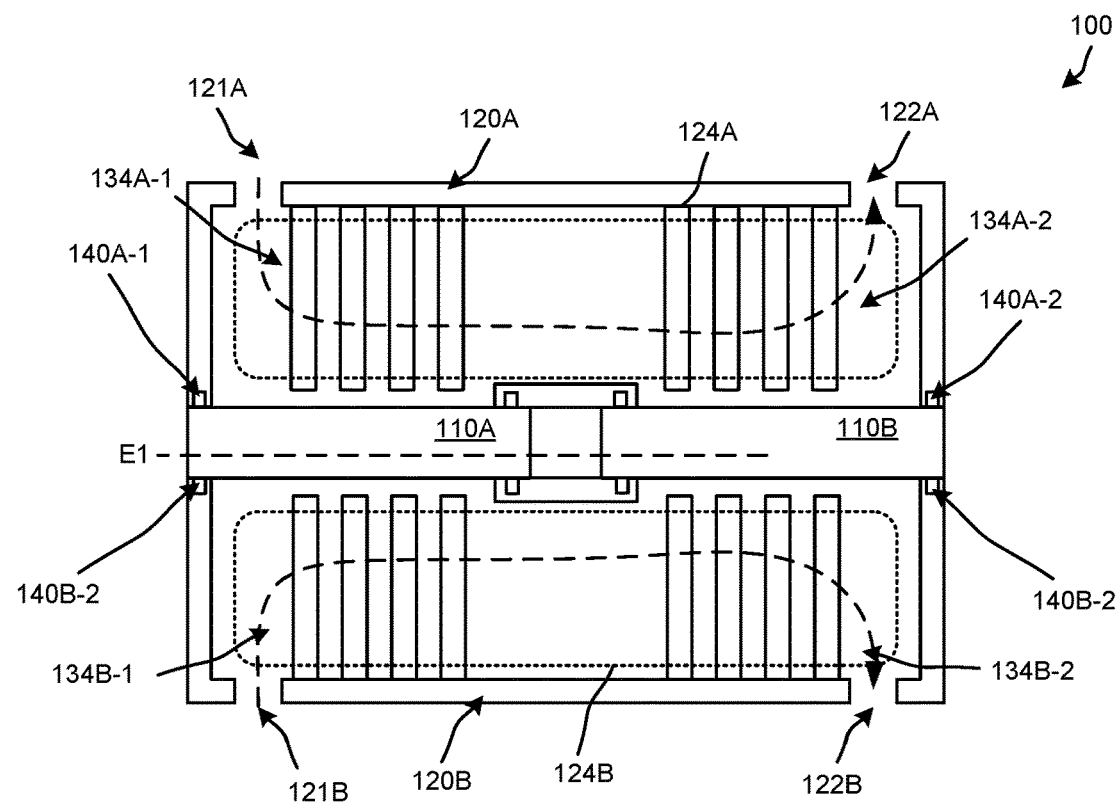

As shown in FIG. 9A, the module assembly 100 includes a first cover 120A, a first channel 124A, and first sealing mechanisms 140A-1, 140A-2 disposed on a first side (e.g., a top side) of the module 110 and a second cover 120B, a second channel 124B, and second sealing mechanisms 140B-1, 140B-2 disposed on a second side (e.g., a bottom side) of the module 110. Inlet opening 121A and outlet opening 122A are associated with channel 124A, and inlet opening 121B and outlet opening 122B are associated with channel 124B.

This implementation shown in FIG. 9A includes protrusions 134A-1 and 134B-1 associated with, and disposed on opposite sides of, module 110A for dual-sided cooling of module 110A. Similarly, this implementation includes protrusions 134A-2 and 134B-2 associated with, and disposed on opposite sides of, module 110B for dual-sided cooling of module 110B.

Figure 9B:
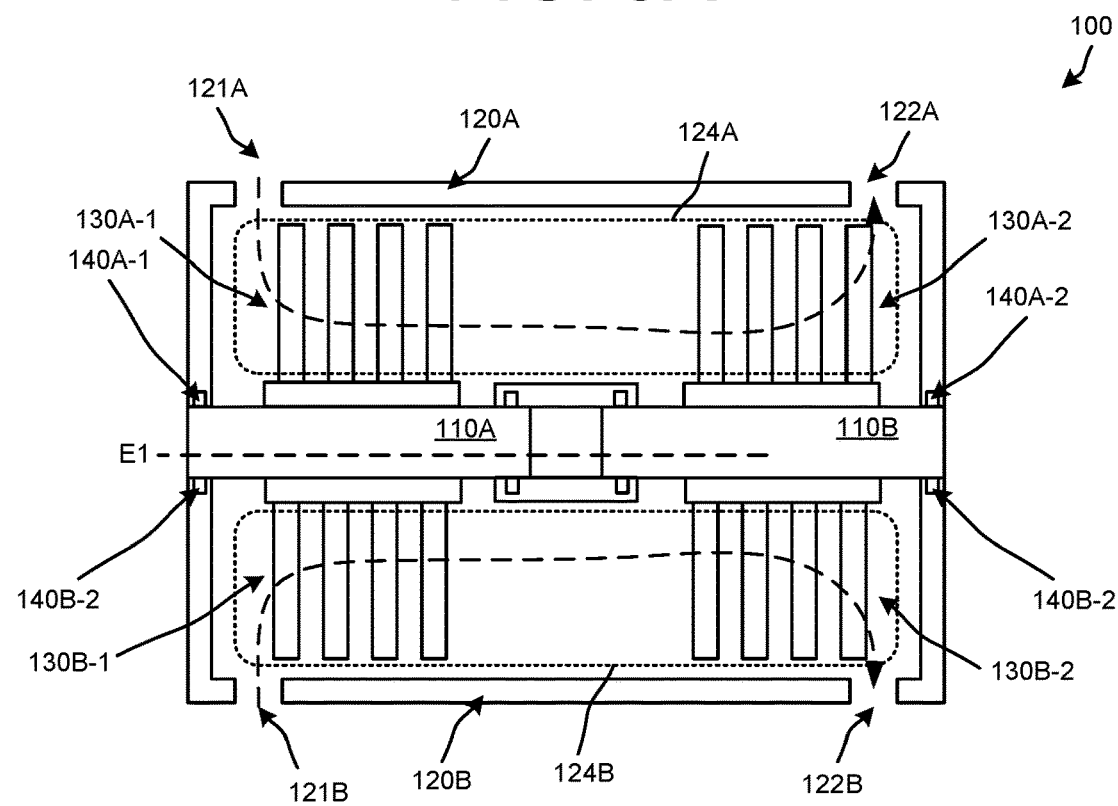

FIG. 9B illustrates a variation of the module assembly 100 shown in FIG. 9A with heatsinks 130A-1, 130A-2, 130B-1, 130B-2 rather than cover protrusions. The common features will not be described again in connection with FIG. 9A to simplify the description.

The features shown in FIGS. 9A and 9B can be applied to any of the implementations described herein. For example, the implementations described in connection with FIGS. 1 through 8 can be applied in the dual-sided cooling configuration shown in FIGS. 9A and 9B.

Although the flow of fluid is shown as being in the same direction within the channels 124A, 124B in FIGS. 9A and 9B, in some implementations, the flow of fluid can be in opposite directions. For example, fluid flow can be in a first direction within channel 124A, and fluid flow can be in a second direction opposite the first direction within channel 124B.

Although not shown in FIGS. 9A and 9B, different combinations of heat-transfer mechanisms can be included in the channels 124A, 124B. For example, cover protrusions and a heatsink can be associated with module 110A and disposed on opposite sides of module 110A. As another example, cover protrusions and a heatsink can be included in a single channel (e.g., channel 124A).

Although not shown in FIGS. 9A and 9B, a single set of inlet and outlet openings can be associated with both channels 124A, 124B. Such implementations are described in more detail below (e.g., at least FIGS. 13 through 16).

Although not shown in FIG. 9B, a heatsink can be configured to span across multiple modules. For example, a single heatsink can be configured to span across modules 110A and 110B. In such implementations, the sealing mechanisms can be handled differently than shown in FIG. 9B without a support portion (e.g., support portion 128 shown in FIG. 8). Such an example implementation is shown and described in connection with at least FIG. 16 below.

Figure 10:
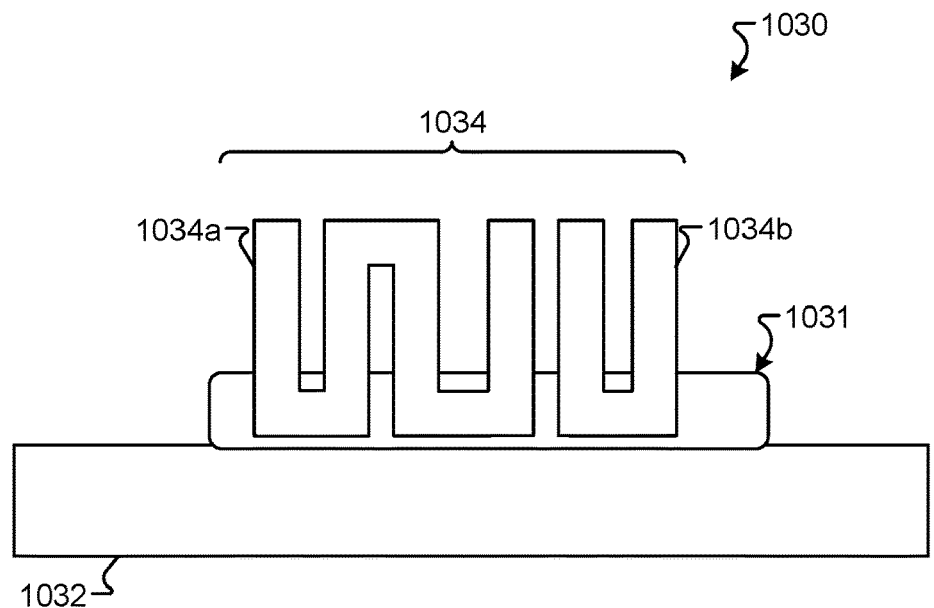
FIGS. 10 and 11 illustrate examples of heatsinks.
Figure 11:
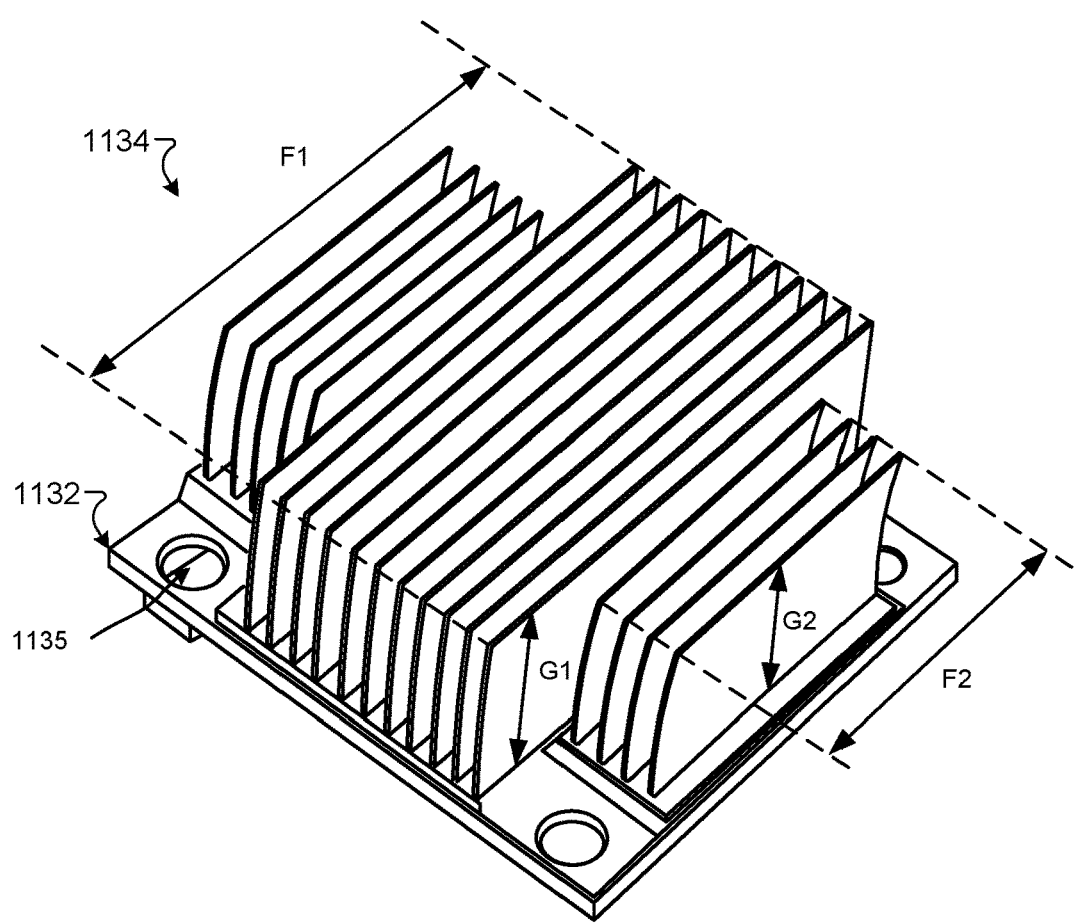

FIGS. 10 and 11 illustrate examples of heatsinks that can be used to provide non-direct (e.g., in-direct) cooling for modules (e.g., modules 110) within a module assembly (e.g., module assembly 100). FIG. 10 illustrates a cross-sectional view 130 of a bi-metal heatsink 1030. The bi-metal heatsink 1030 can be fabricated without the need for welding, reducing power supply assembly costs and, as such, reducing the overall cost of the power supply. The bi-metal heatsink 1030 can include different types of metals for different portions of the heatsink 1030.

Specifically, the bi-metal heatsink 1030 includes a copper (Cu) base plate 1032 that can be nickel (Ni) plated, and one or more protrusions 1034*a*, 1034*b* (e.g., fin structures) that can be made of different metals—nickel-plated and copper (Cu) foil, respectively. The protrusions 1034*a-b* can be soldered onto the base plate 1032 using a solder 1031. Therefore, no welding is required. In some cases, the protrusions 1034a-b and the base plate 1032 can be produced separately before assembly into the bi-metal heatsink 1030. In this implementation, at least one of the protrusions 1034 (or any of the protrusions 134 described herein) has a serpentine structure. In some implementations, all of the protrusions 1034 can be included in a serpentine structure.

FIG. 11 illustrates a perspective view of an example heatsink 1134. The heatsink 1134 can be a bi-metal heatsink. As shown in FIG. 11, the protrusions (e.g., fins) can have different lengths F1, F2 and different heights G1, G2. Specifically, a first set of the protrusions 1134 (in a middle portion of the protrusions disposed between outer portions of protrusions) has a height G1 that is greater than a height G2 of a second set of the protrusions 1134 (in an outer portion of the protrusions). The first set of the protrusions 1134 has a length F1 that is greater than a length F2 of the second set of the protrusions 1134. The heatsink 1134 also include openings 1135 in the substrate 1132 that can be used to couple the heatsink 1134 to, for example, a cover and/or a module.

Figure 12:
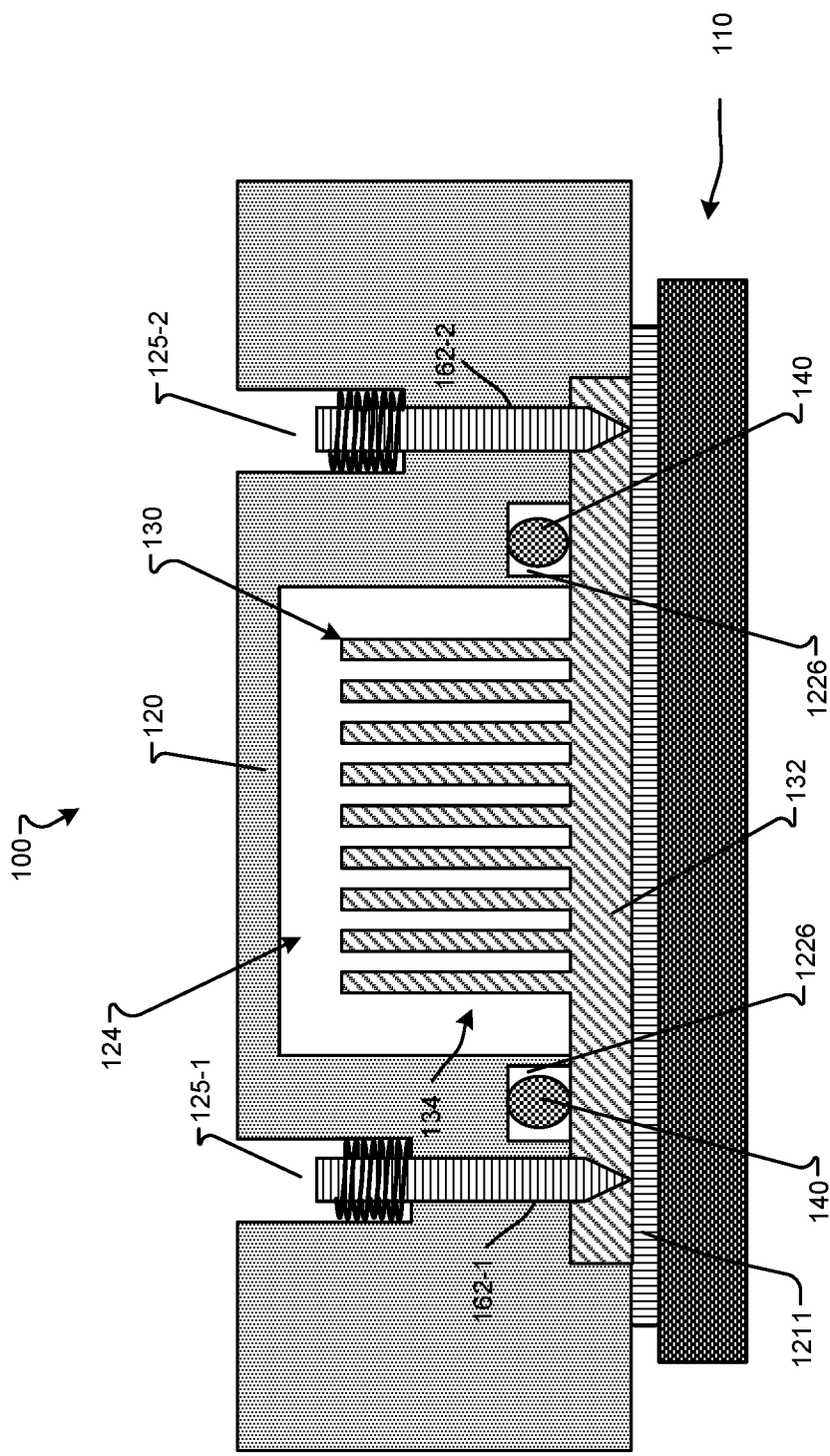
FIG. 12 is a diagram that illustrates a variation of the module assembly shown in FIG. 6.

FIG. 12 is a diagram that illustrates a variation of the module assembly shown in FIG. 6. In this variation, the cover 120 is coupled to the substrate 132 of the heatsink via spring-loaded screws 162-1, 162-2 that are disposed within recesses 125-1, 125-2. The sealing mechanism 140 can be disposed within a groove 1226 (e.g., a recess) within the cover 120. Leakage from the channel 124 can be reduced, prevented, or eliminated by using the sealing mechanism 140 with the spring-loaded screws 125-1, 125-2.

A thermal interface material (TIM) 1211 can be disposed between the substrate 132 of the heatsink 130 and the module 110 (e.g., a DBM substrate of the module 110). In this implementation, the cover 120 can be coupled to (e.g., screwed to, fixedly coupled to) a subcomponent that includes the heatsink 130, the TIM 1211 and the module 110.

Figure 13:
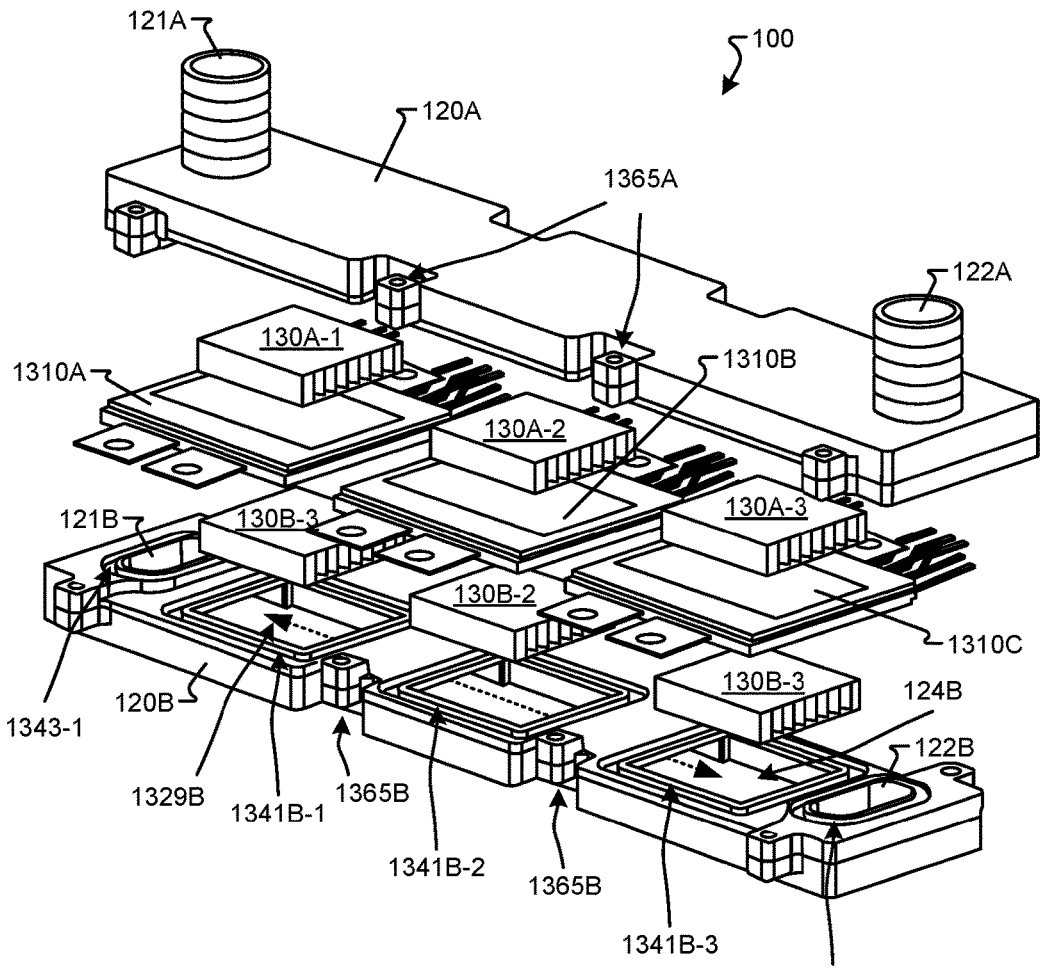
FIG. 13 illustrates an exploded view of components included in a module assembly.

FIG. 13 illustrates an exploded view of components included in a module assembly 100. The module assembly 100 includes a first cover 120A and a second cover 120B. The module assembly 100 includes heat-transfer mechanisms 130A-1 through 130A-3 on one side of the modules 1310A through 1310C and heat-transfer mechanisms 130B-1 through 130B-3. In this implementation, the heat-transfer mechanisms 130A-1 through 130A-3 and 130B-1 through 130B-3 are heatsinks.

An inlet opening 121A (and port) and an outlet opening 122A (and port) are included in the cover 120A for fluid flow through channels in the covers 120A, 120B. A channel 124B within cover 120B is shown in FIG. 13, and a channel within cover 120A is not visible in FIG. 13. An inlet opening 121B and an outlet opening 122B are included in the cover 120B for fluid flow to be received from the cover 120A and into the channel 124B. The inlet opening 121B and an outlet opening 122B are in fluid communication with the channel 124B. When assembled, the inlet opening 121A and the outlet opening 122A are in fluid communication with the channel 124B because the openings 121A and 122A are through the entirety of the cover 120A (and provide access to the openings 121B, 122B).

For example, a fluid may flow from the inlet opening 121A of cover 120A through opening 121B and along the double-sided arrow disposed within the channel 124B shown in FIG. 13. The fluid may flow from the outlet opening 122B of cover 120B through opening 122A of the cover 120A.

Grooves 1341B-1 through 1341B-3 (also can be referred to as recesses) for sealing mechanisms are included in the cover 120B. Grooves 1343-1 and 1343-2 (also can be referred to as recesses) are included in the cover 120B so that the openings 121A, 122A of cover 120A can be sealed to the openings 121B, 122B of cover 120B. An o-ring, a sealant, or some other material may be disposed in one or more of the grooves 1341B-1 through 1341B-3 and/or 1343-1, 1343-2.

The covers 120A, 120B includes flanges 1365A, 1365B, respectively. The covers 120A, 120B (and the components included therein or therebetween (e.g., modules)) can be coupled using the flanges 1365A, 1365B. Specifically, a coupling mechanism (such as those described above) (e.g., a screw, a rivet, etc.) can be used to couple the covers 120A, 120B via the flanges 1365A, 1365B.

As shown in FIG. 13, each of the covers includes openings that are associated with each of the modules. For example, opening 1329B is included in the cover 120B and is associated with heatsink 130B-3 and module 13010A. The heatsink 130B-3 can be disposed within the opening 1329B. The opening 1329B is in fluid communication with the channel 124B and the openings 121B and 122B. In this implementation, the groove 1341B-1 (and/or sealing mechanism) defines a perimeter around or along the opening 1329B.

Figure 14:
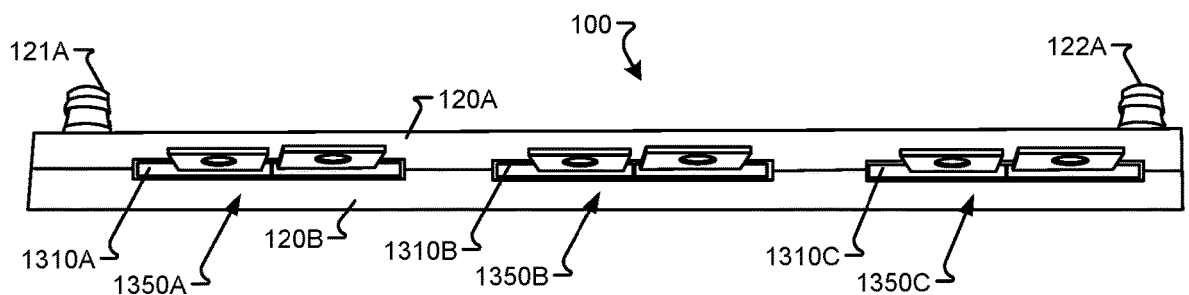
FIG. 14 is a diagram that illustrates a side view of an example module assembly that can be a variation of the module assembly shown in FIG. 13.

FIG. 14 is a diagram that illustrates a side view of an example module assembly 100 that can be a variation of the module assembly shown in FIG. 13. In this diagram all of the components of FIG. 13 are coupled together. Leads 1350A through 1350C of the modules 1310A through 1310C are shown.

Figure 15:
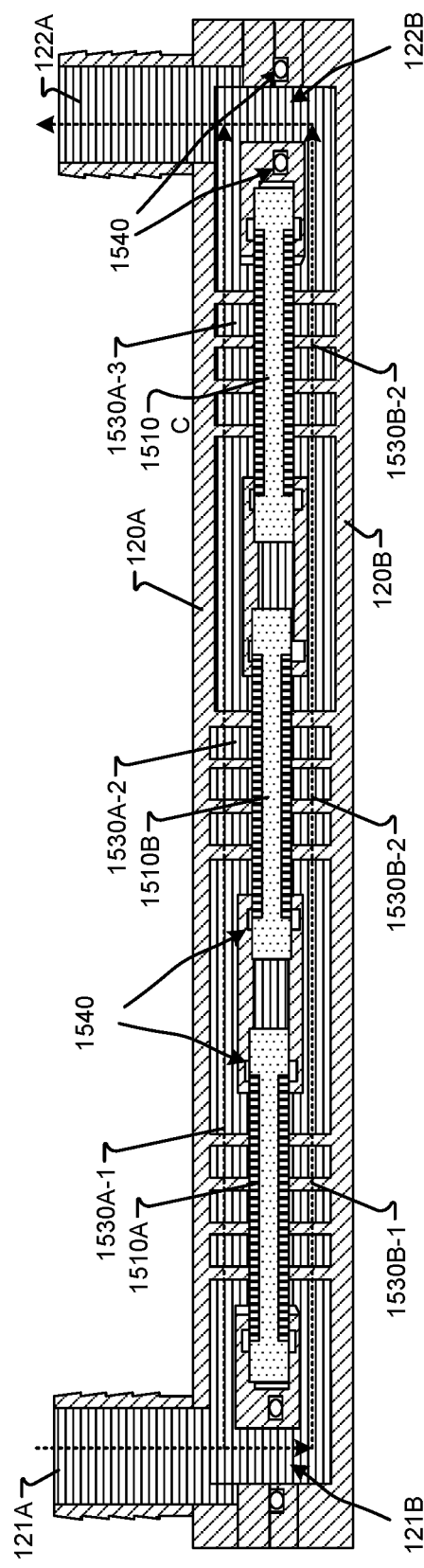
FIGS. 15 and 16 illustrate side cross-sectional views of example module assemblies.
Figure 16:
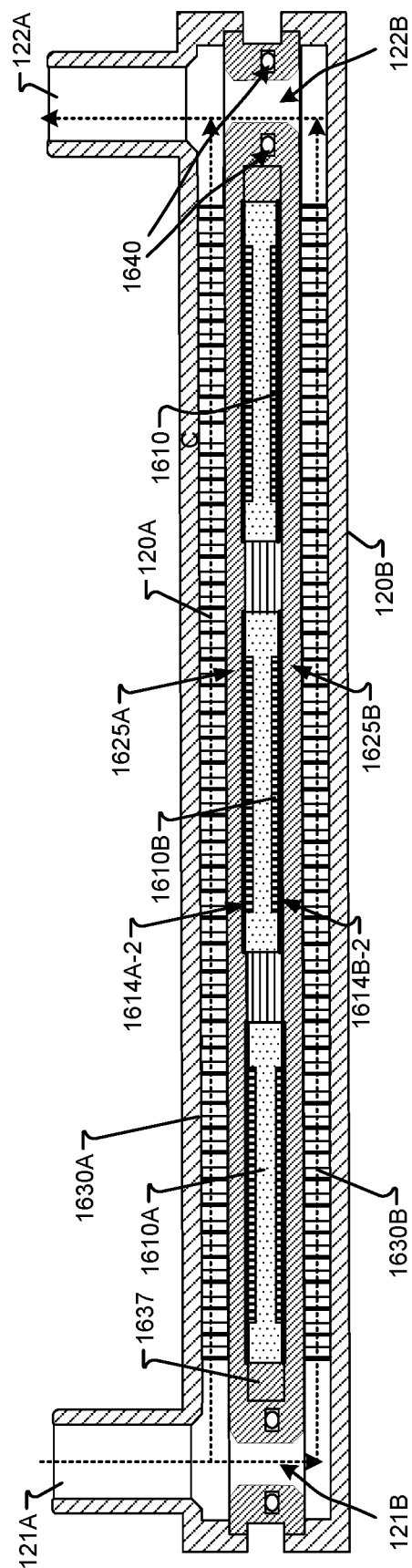

FIGS. 15 and 16 illustrate side cross-sectional views of example module assemblies 100 similar to those shown in FIGS. 13 and 14, and can be variations of the other module assemblies 100 described above. The module assembly 100 shown in FIG. 15 includes a first cover 120A coupled to a second cover 120B. The module assembly 100 includes a set of heat-transfer mechanisms 1530A-1 through 1530A-3 on one side of modules 1510A through 1510C and a set of heat-transfer mechanisms 1530B-1 through 1530B-3. In this implementation, the heat-transfer mechanisms 1530A-1 through 1530A-3 and 1530B-1 through 1530B-3 are cover protrusions. Each of the modules 1510A through 1510C can be a module for dual-sided cooling and can include one or more DBM substrates (e.g., DBC substrates). Sealing mechanisms 1540 (only a few are labeled) are used to seal the elements includes in this module assembly 100.

An inlet opening 121A (and port) and an outlet opening 122A (and port) are included in the cover 120A for fluid flow through the channels 1524A, 1524B in the covers 120A, 120B. The fluid flow within the module assembly 100 is illustrated by the arrows. The covers 120A, 120B shown in FIG. 15 can be made of, for example, a composite plastic material.

The module assembly 100 shown in FIG. 16 includes a first cover 120A coupled to a second cover 120B. The module assembly 100 includes a heat-transfer mechanism 1630A on one side of modules 1610A through 1610C and a heat-transfer mechanism 1630B. In this implementation, the heat-transfer mechanisms 1630A, 1630B are heatsinks. Each of the modules 1610A through 1610C can be a module for dual-sided cooling and can include one or more DBM substrates (e.g., DBC substrates).

In some implementations, the heatsinks 1630A, 1630B, respectively, can be integrated into the covers 120A, 120B. In some implementations, the heatsinks 1630A, 1630B, respectively, can be monolithically formed within the covers 120A, 120B. In some implementations, the covers 120A, 120B shown in FIG. 16 can be made of, for example, a metallic material.

As shown in FIG. 16, the heatsinks 1630A, 1630B span across all of the modules 1610A through 1610C. This is enabled by the structure of inner walls 1625A, 1625B, respectively, of the covers 120A, 120B. Specifically, the heatsinks are in contact with (e.g., coupled to) inner walls 1625A, 1625B, respectively, of the covers 120A, 120B. The inner walls 1625A, 1625B are in contact with the modules 1610A through 1610C. Accordingly, when the covers 120A, 120B are coupled together as shown in FIG. 16, the inner walls 1625A, 1625B define a cavity 1637 (e.g., a space) within which the modules 1610A through 1610C are disposed. The height of the cavity 1637 can be large enough that the modules 1610A through 1610C may be disposed therein.

In this implementation, the inner walls 1625A, 1625B can function as a substrate of a heatsink. In some implementations, one or more of the inner walls 1625A, 1625B can be replaced by a substrate of a heatsink. In some implementations, one or more of the inner walls 1625A, 1625B can defines portions of channels of the respective covers 120A, 120B.

As shown in FIG. 16, a thermal interface material is disposed between each of the modules 1610A through 1610C and inner walls 1625A, 1625B. For example, a thermal interface material 1614A-2 is disposed between the inner wall 1625A of the cover 120A and the module 1610B. Similarly, a thermal interface material 1614B-2 is disposed between the inner wall 1625B of the cover 120B and the module 1610B.

Sealing mechanisms 1640 (only a few are labeled) are used to seal the elements includes in this module assembly 100. Because of the configuration with the cavity 1637, the sealing mechanisms 1640 are used for fluid flow between the openings 121A, 122B, but are not included between the modules 1610A through 1610C.

Figure 17:
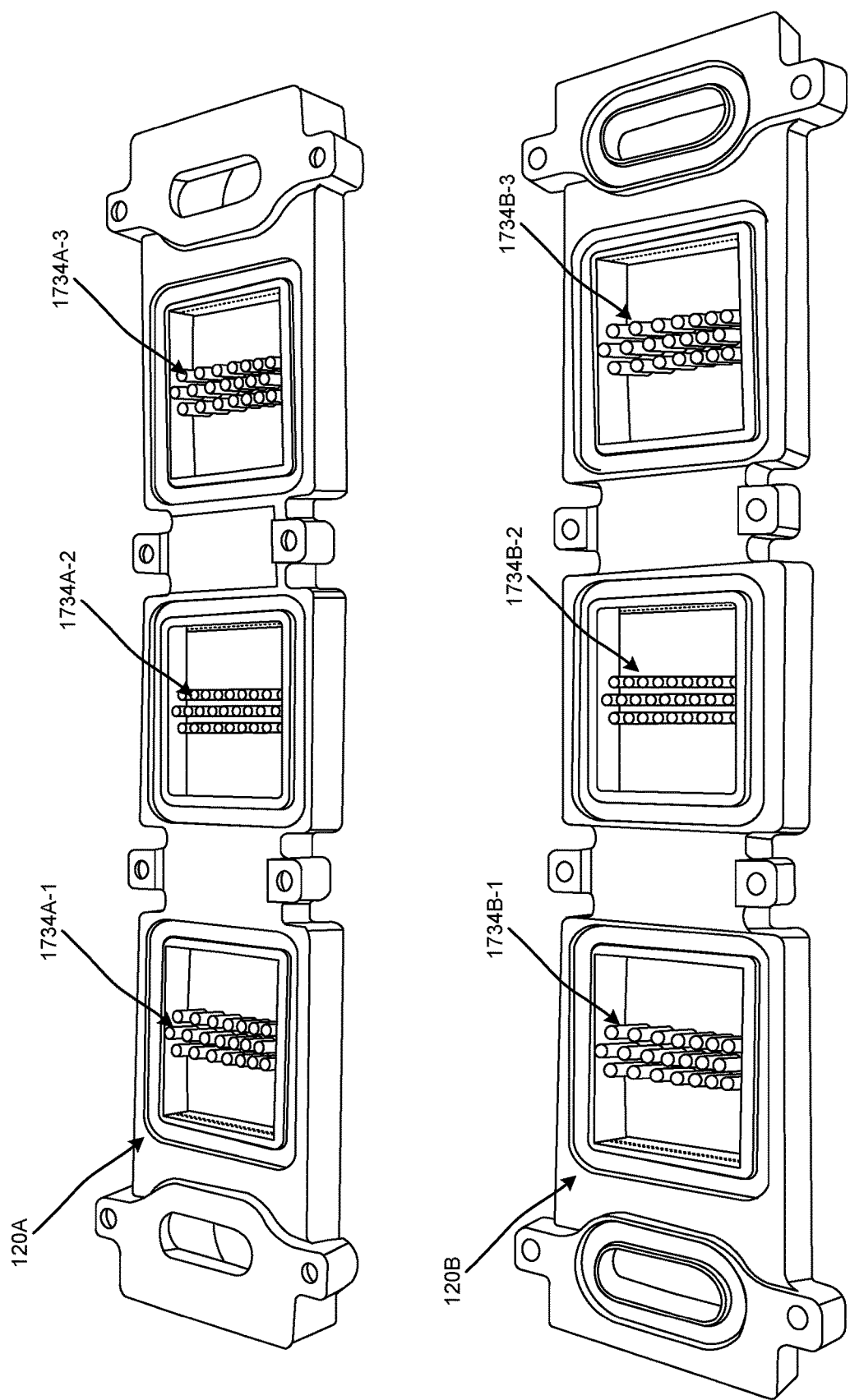
FIG. 17 is a diagram that illustrates example covers.

FIG. 17 is a diagram that illustrates a cover 120A and a cover 120B that includes cover protrusions 1734 (e.g., protrusions 1734A-1 through 1734A-3 associated with cover 120A and protrusions 1734B-1 through 1734B-3 associated with cover 120B). The covers 120A, 120B can be used in any of the module assembly implementations described herein including cover protrusions. The cover protrusions 1734 in this implementation are pillar-like structures and are defined within sets that can be respectively associated with each of the modules. For example, the cover protrusions 1734A-2 are a set of protrusions that can be associated with a first module, and the cover protrusions 1734A-3 are a set of protrusions that can be associated with a second module.

FIGS. 18A through 18H illustrate a method of manufacturing at least some of the heatsink-based module assemblies 100 described herein. The manufacturing process is illustrated in cross-sectional views.

FIG. 18A illustrates a heatsink 1830 with protrusions 1834 coupled to a substrate 1832. The protrusions 1834 (e.g., a serpentine protrusion, a copper pin foil that is nickel plated) can be coupled to the substrate 1832 (e.g., a copper base plate that is nickel plated) via a solder 1833 that is printed or dispensed on the substrate 1832. The solder 1833 can be reflowed after the protrusions 1834 are coupled to the substrate 1832 via the solder 1833.

FIG. 18B illustrates a cover 1820A (e.g., top cover) and a cover 1820B (e.g., bottom cover). An example of a sealing mechanism 1840 that can be included in grooves 1826A, 1826B (e.g., recesses) of the covers 1820A, 1820B, respectively, is illustrated.

FIG. 18C illustrates that heatsinks 1830A, 1830B are coupled to the covers 1820A, 1820B with at least a portion of the heat sinks 1830A, 1830B being disposed within channels 1824A, 1824B. The combination of the covers 1820A, 1820B and heatsinks 1830A, 1830B defines cover sub-assemblies 1870A, 1870B. The cover 1820A includes an inlet opening 122A.

Figure 18D:
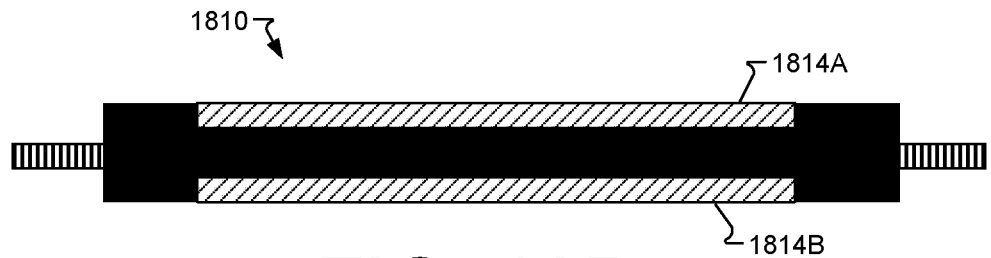

FIG. 18D illustrates a module 1810 that includes DBM substrates 1814A, 1814B. The module 1810 can include one or more semiconductor die.

Figure 18E:
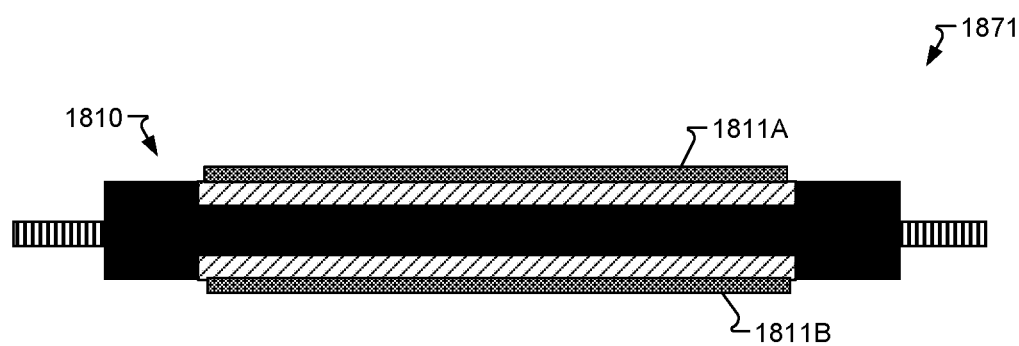

FIG. 18E illustrates a module sub-assembly 1871 including thermal interface material layers 1811A, 1811B formed on (e.g., printed onto) at least the DBM substrates of the module 1810. In some implementations, a connection pad can be coupled to the DBM substrates instead of the thermal interface material layers 1811A, 1811B.

Figure 18F:
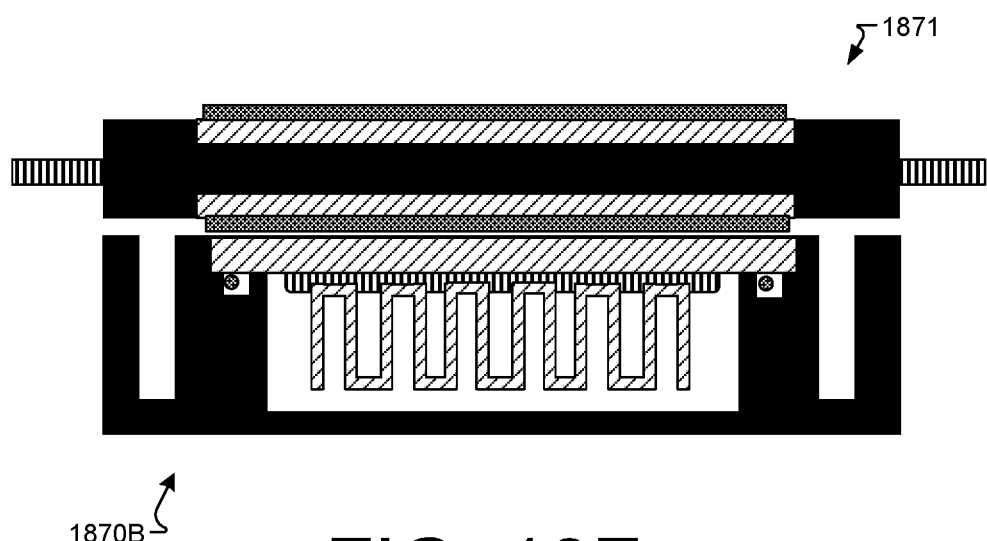
Figure 18G:
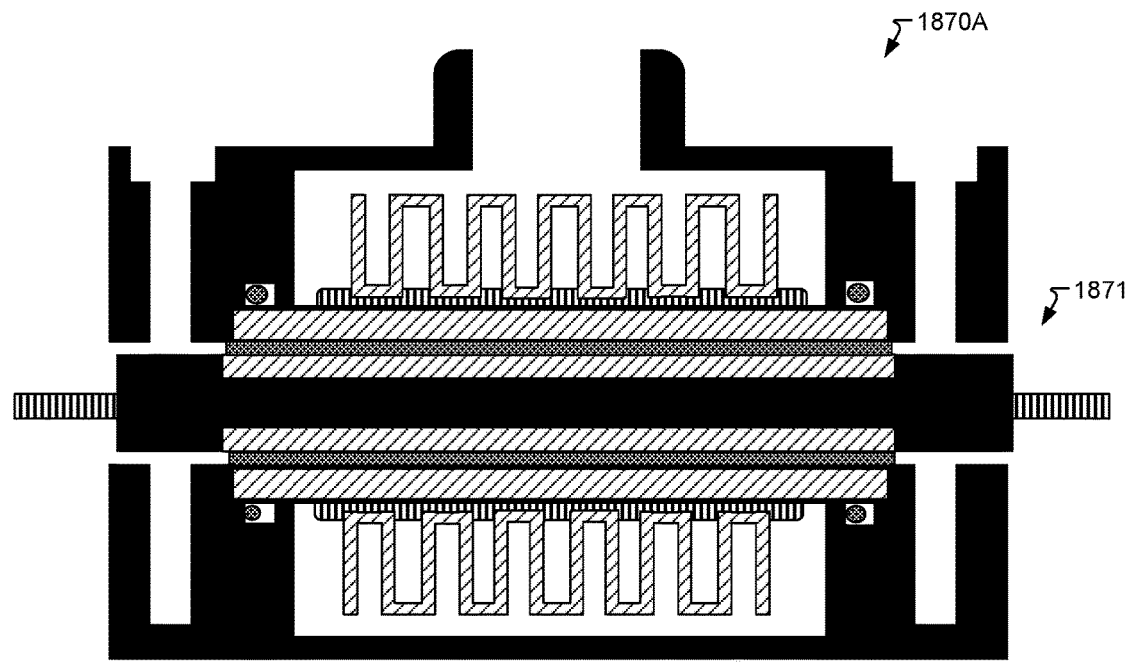

FIG. 18F illustrates the cover sub-assembly 1870B coupled to a first side of the module sub-assembly 1871 (such that the substrate of the heatsink 1830B is coupled to DBM substrate 1814B via the TIM 1811B). FIG. 18G illustrates the cover sub-assembly 1870A coupled to a second side of the module sub-assembly 1871.

Figure 18H:
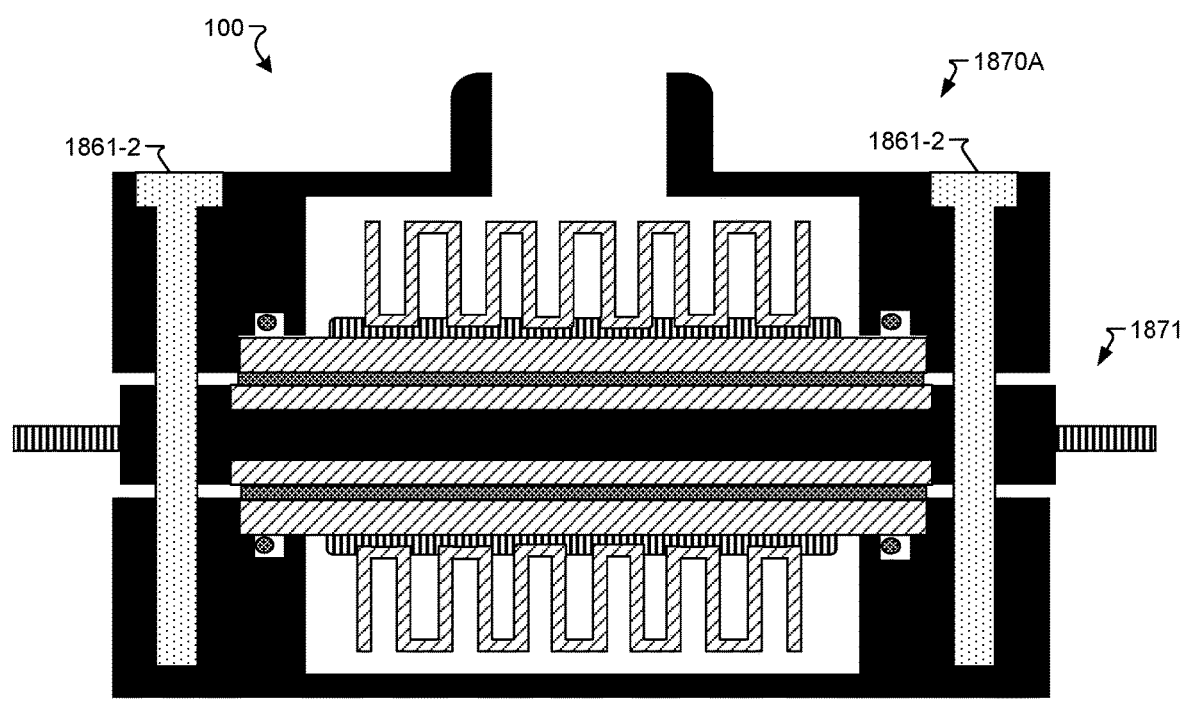

FIG. 18H illustrates the final module assembly 100 being formed via coupling mechanisms 1862-1, 1862-2 coupling the cover 1820A to the cover 1820B. In this implementation, the coupling mechanisms 1862-1, 1862-2 are disposed within (e.g., coupled within) holes through the cover 1820A and disposed within recesses within the cover 1820B.

FIGS. 19A through 19F illustrate a method of manufacturing at least some of heatsink-based module assemblies 100 described herein. The manufacturing process is illustrated in cross-sectional views.

FIG. 19A illustrates a module 1910 that includes DBM substrates 1914A, 1914B. The module 1910 can include one or more semiconductor die. In this implementation, the DBM substrates 1914A, 1914B can be plated (e.g., nickel plated) with a metal so that heatsinks can be directly coupled (e.g., bonded) to the DBM substrates 1914A, 1914B before covers are installed.

FIG. 19B illustrates a heatsink 1930A with protrusions 1934A coupled to the DBM substrate 1914A. The heatsink 1930A is manufactured directly on the module 1910. The protrusions 1934A (e.g., a serpentine protrusion, a copper pin foil that is nickel plated) can be coupled to the DBM substrate 1914A via a solder 1933A that is printed or dispensed on the DBM substrate 1914A. The solder 1933A can be reflowed after the protrusions 1934A are coupled to the DBM substrate 1914A via the solder 1933A.

FIG. 19C illustrates a heatsink 1930B with protrusions 1934B coupled to the module 1910 via a solder 1933B using a methodology similar to that described in connection with the formation of the heatsink 1930A. The sub-assembly shown in FIG. 19C can be referred to as a heatsink-module sub-assembly 1980.

Figure 19D:
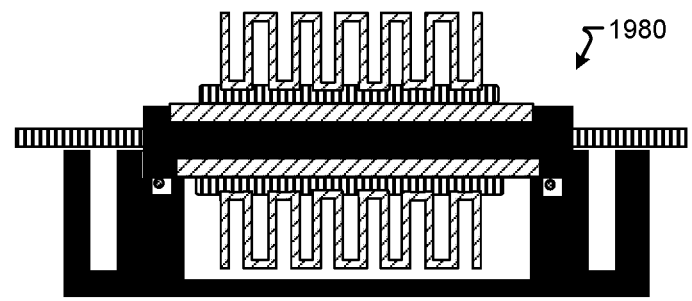
Figure 19E:
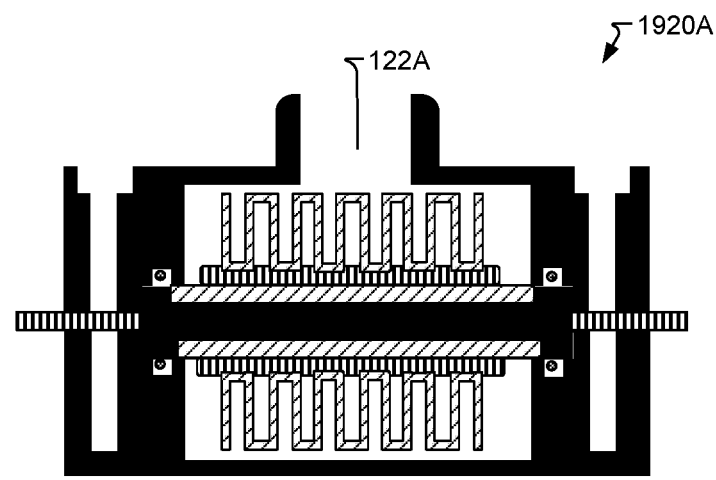

FIGS. 19D and 19E illustrate, respectively, a cover 1920B (e.g., bottom cover) and a cover 1920A (e.g., top cover) coupled to the heatsink-module sub-assembly 1980. In some implementations, cover 1920A can be coupled to the heatsink-module sub-assembly 1980 before the cover 1920B.

Similar to that described in connection with FIGS. 18A through 18H, a sealing mechanism can be included in grooves (e.g., recesses) of the covers 1920A, 1920B illustrated.

Figure 19F:
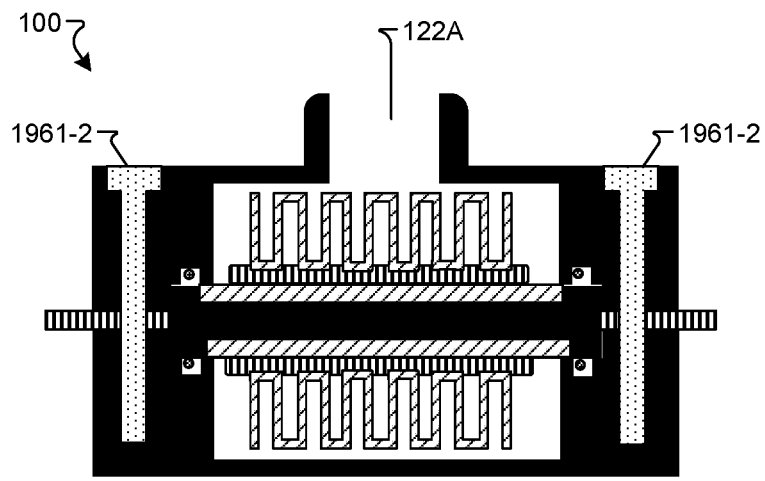

The final module assembly 100 shown in FIG. 19F can be formed via coupling mechanisms 1962-1, 1962-2 coupling the cover 1920A to the cover 1920B similar to the fashion described in connection with FIG. 18H. In this implementation, the coupling mechanisms 1962-1, 1962-2 are disposed within (e.g., coupled within) holes through the cover 1920A and disposed within recesses within the cover 1920B.

FIGS. 20A through 20D illustrate a method of manufacturing at least some of cover-protrusion module assemblies 100 described herein. The manufacturing process is illustrated in cross-sectional views.

FIG. 20A illustrates a cover 2020A (e.g., top cover) and a cover 2020B (e.g., bottom cover) with cover protrusions 2034A, 2034B. An example of a sealing mechanism 2040 that can be included in grooves 2026A, 2026B (e.g., recesses) of the covers 2020A, 2020B, respectively, is illustrated.

FIG. 20B illustrates the cover 1820B coupled to a module 2010 that includes DBM substrates 2014A, 2014B. The module 2010 can include one or more semiconductor die. FIG. 20C illustrates the cover 1820A coupled to a module 2010. In some implementations, cover 2020A can be coupled to the module 2010 before the cover 2020B.

The final module assembly 100 shown in FIG. 20D can be formed via coupling mechanisms 2062-1, 2062-2 coupling the cover 2020A to the cover 2020B similar to the fashion described in connection with FIGS. 18H and 19F. In this implementation, the coupling mechanisms 2062-1, 2062-2 are disposed within (e.g., coupled within) holes through the cover 2020A and disposed within recesses within the cover 2020B.

Figures 21, 22:
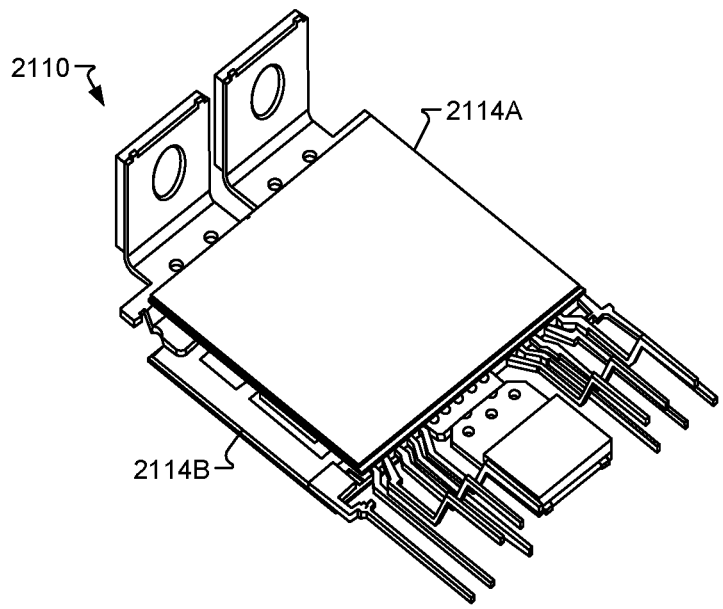
FIG. 21 is a diagram that illustrates an example module.
FIG. 22 is a flowchart that illustrates a method for manufacturing the module assemblies described herein.

FIG. 21 is a diagram that illustrates an example module 2110. The module 2110 that includes DBM substrates 2114A, 2114B. The module 2110 can include one or more semiconductor die.

FIG. 22 is a flowchart that illustrates a method for manufacturing the module assemblies described herein. As shown in FIG. 22, the method can include forming a module including a semiconductor die and a direct bonded metal substrate (block 2200). The semiconductor die can be encapsulated in a molding material within the module. The direct bonded metal substrate can have an inner surface electrically coupled to the semiconductor die.

As shown in FIG. 22, the method can include coupling a cover around at least a portion of the module such that a heat-transfer mechanism is disposed within a channel of the cover between a wall of the cover and the module (block 2210). In some implementations, the heat-transfer mechanism is a heatsink coupled to the cover or the module before the cover is coupled around the module. In some implementations, the heat-transfer mechanism includes a cover protrusion extending from the cover.

It will be understood that, in the foregoing description, when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Implementations of the various techniques described herein may be implemented in (e.g., included in) digital electronic circuitry, or in computer hardware, firmware, software, or in combinations of them. Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. An apparatus, comprising:
a module including a semiconductor die;
a heatsink coupled to the module and including:
  a substrate, and
  a plurality of protrusions;
a cover defining a channel, the channel being outside of the module, the plurality of protrusions of the heatsink being disposed within the channel, the cover being disposed around a side portion and a top portion of the plurality of protrusions, at least a portion of the module being exposed outside of the cover; and
a sealing mechanism disposed between the cover and the module and in contact with the module.

2. The apparatus of claim 1, wherein the cover includes an inlet opening and an outlet opening in fluid communication with the inlet opening via the channel.

3. The apparatus of claim 1, wherein the channel is a first channel, the cover is a first cover including the first channel, the heatsink is a first heatsink, the first cover and the first heatsink are on a first side of the module,
the apparatus, further comprising:
a second heatsink coupled to a second side of the module; and
a second cover including a second channel, the second heatsink being disposed within the second channel.

4. The apparatus of claim 3, wherein the first cover is coupled to the second cover via a coupling mechanism disposed lateral to the module.

5. The apparatus of claim 1, wherein the module is a first module, the heatsink is a first heatsink,
the apparatus further comprising:
a second module; and
a second heatsink coupled to the second module, the second heatsink having a plurality of protrusions within the channel, the first heatsink and the second heatsink being aligned along the channel.

6. The apparatus of claim 1, wherein the plurality of protrusions including at least one protrusion having an end separated from an inner surface of the channel by a gap.

7. The apparatus of claim 1, wherein the sealing mechanism is in contact with the substrate of the heatsink.

8. The apparatus of claim 1, further comprising:
a coupling mechanism coupling the cover to the substrate of the heatsink.

9. The apparatus of claim 8, wherein the coupling mechanism is at least one of screw, a rivet, a clasp, a latch, an anchor, a spring, a press-fit mechanism, or a glue.

10. The apparatus of claim 1, wherein the sealing mechanism is in contact with at least a portion of the module.

11. The apparatus of claim 1, wherein the sealing mechanism includes an o-ring disposed within a groove included in the cover.

12. The apparatus of claim 1, wherein the module is aligned along a first plane, the sealing mechanism is aligned along a second plane, the sealing mechanism is disposed along a perimeter of the module.

13. The apparatus of claim 1, wherein the heatsink includes a first metal and a second metal.

14. The apparatus of claim 1, wherein the module is a dual-sided module including a direct bonded metal substrate.

15. The apparatus of claim 1, wherein the module includes a direct bonded metal substrate in contact with the semiconductor die, the direct bonded metal substrate includes a dielectric layer disposed between a pair of metal layers.

16. The apparatus of claim 1, wherein the sealing mechanism includes a sealant.

17. An apparatus, comprising:
a module including a semiconductor die;
a cover including:
a channel being in fluid communication with an outside surface of the module, and
a plurality of protrusions extending from an inner surface of the cover into the channel; and
a sealing mechanism disposed between the cover and the module and in contact with the module, at least a portion of the module being exposed outside of the cover.

18. The apparatus of claim 17, wherein an end of at least one of the plurality of protrusions is separated from a surface of the module by a gap.

19. The apparatus of claim 17, wherein the cover includes an inlet opening and an outlet opening in fluid communication with the inlet opening via the channel.

20. The apparatus of claim 17, wherein the cover includes an inlet opening and an outlet opening in fluid communication with the inlet opening via the channel, the module is a first module,
the apparatus, further comprising:
a second module, the first module and the second module being aligned along the channel between the inlet opening and the outlet opening.

21. An apparatus comprising:
a semiconductor die encapsulated in a molding material within a module;
a lead coupled to the module;
a direct bonded metal substrate having an inner surface electrically coupled to the semiconductor die; and
a cover around at least a portion of the module such that a heat-transfer mechanism is disposed within a channel of the cover between a wall of the cover and the module and such that at least a portion of the module is exposed outside of the cover, the channel being disposed outside of the module, the lead extending from the portion of the module exposed outside of the cover.

22. The apparatus of claim 21, wherein the heat-transfer mechanism is a heatsink coupled to the cover or the module before the cover is coupled around the module.

23. The apparatus of claim 21, wherein the heat-transfer mechanism includes a cover protrusion extending from the cover.

* * * * *